United States Patent
Sanada

[19]

[11] Patent Number: 5,943,346
[45] Date of Patent: *Aug. 24, 1999

[54] FAULT POINT ESTIMATING SYSTEM USING ABNORMAL CURRENT AND POTENTIAL CONTRAST IMAGES

[75] Inventor: Masaru Sanada, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/714,298

[22] Filed: Sep. 18, 1996

[30] Foreign Application Priority Data

Sep. 28, 1995 [JP] Japan .................................. 7-274842

[51] Int. Cl.⁶ .................................................. G01R 31/28
[52] U.S. Cl. .......................................... 371/27.1; 324/751
[58] Field of Search .......................... 371/27, 25.1, 22.1, 371/27.1, 27.5; 324/751, 765, 755, 512, 500, 754, 763; 395/183.01, 421.03, 182.06, 183.03, 183.14

[56] References Cited

U.S. PATENT DOCUMENTS

| | | | |
|---|---|---|---|
| 5,406,505 | 4/1995 | Kang et al. | 364/480 |
| 5,493,236 | 2/1996 | Ishii et al. | 324/752 |
| 5,548,211 | 8/1996 | Tujide et al. | 324/158.1 |
| 5,589,780 | 12/1996 | Ueda et al. | 324/751 |
| 5,592,099 | 1/1997 | Kuribara et al. | 324/751 |
| 5,592,100 | 1/1997 | Shida et al. | 324/751 |

FOREIGN PATENT DOCUMENTS

| | | |
|---|---|---|
| 0 504 944 | 9/1992 | European Pat. Off. . |
| 44 03 768 | 2/1995 | Germany . |
| 44 33 733 | 3/1995 | Germany . |

OTHER PUBLICATIONS

New Application of Laser Beam to Failure Analysis of LSI With Multi–Metal Layers, by M. Sanada, Microelectron. Reliab., vol. 33, No. 7, pp. 993–1009, 1993.

"Evaluation and Detection of CMOS–LSI With Abnormal IDDQ," by M. Sanada, Microelectron. Reliab., vol. 35, No. 3, pp. 619–629, 1995.

"Dynamic Fault Imaging of VLSI Random Logic Devices" by T.C. May et al., IEEE IRPS, pp. 95–108, 1984.

H. Ishizuka et al., "Study of Failure Analysis Using Photon Spectrum", REAJ 4–th Symposium, vol. 13, No. 3, pp. 71–76, Nov. 1991.

*Primary Examiner*—Robert W. Beausoliel, Jr.
*Assistant Examiner*—Nadeem Iqbac
*Attorney, Agent, or Firm*—Foley & Lardner

[57] ABSTRACT

In a semiconductor device, a plurality of functional test patterns are generated and transmitted to the semiconductor device, and it is determined whether or not an abnormal current, flows through the semiconductor device. Also, the semiconductor device is irradiated with electrons, and secondary electrons from the semiconductor device are detected. Potential contrast images are calculated in accordance with the detected secondary electrons in response to the functional test patterns. A logic operation is performed upon the potential contrast images to estimate a fault point.

25 Claims, 33 Drawing Sheets

| IN1 | IN2 | OUT |
|-----|-----|-----|
| H | H | L |
| H | L | H |
| L | H | H |
| L | L | H |

| IN1 | IN2 | OUT |
|-----|-----|-----|
| H | H | H |
| H | L | H |
| L | H | H |
| L | L | H |

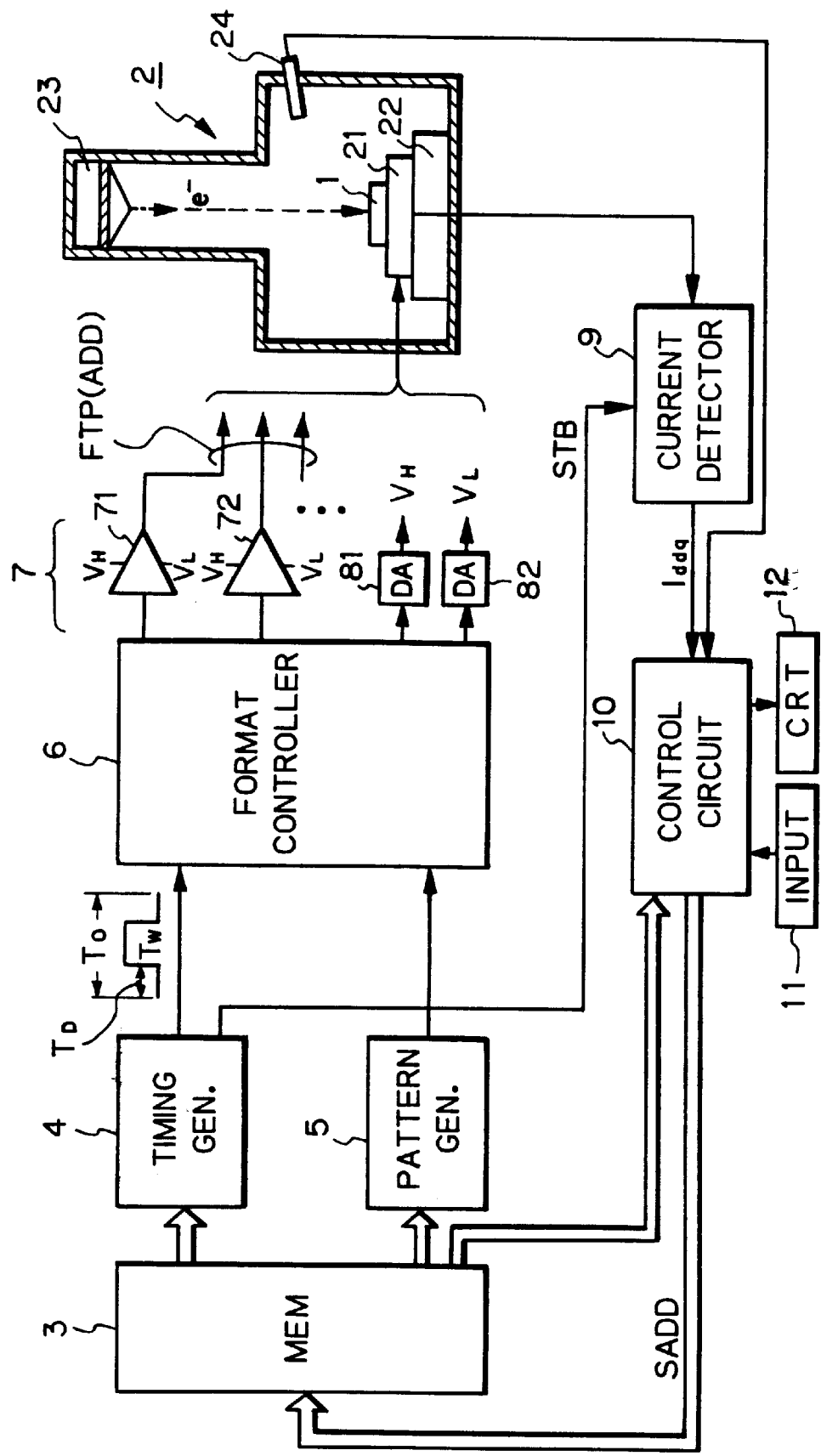

Fig. 5A
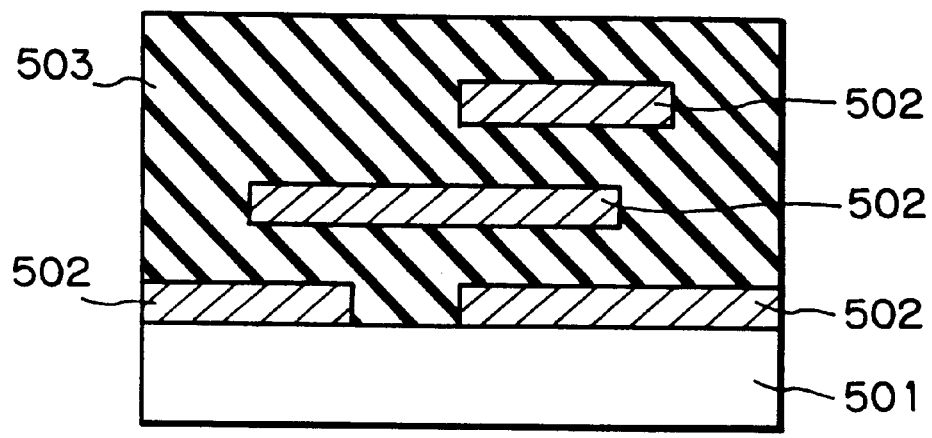
Fig. 5B
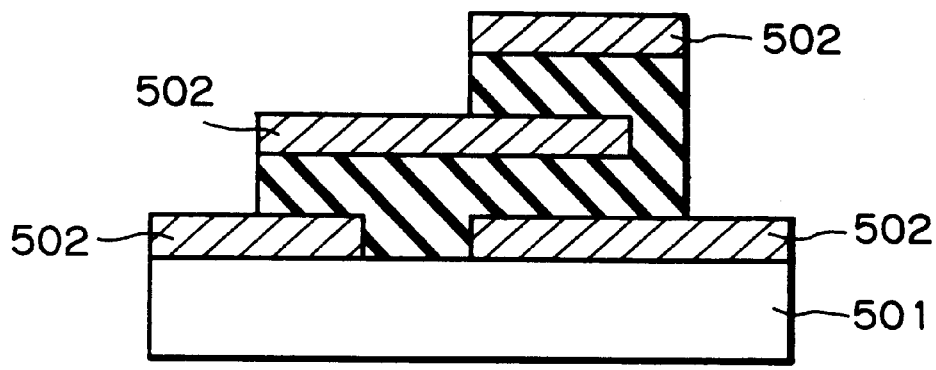

Fig. 7A
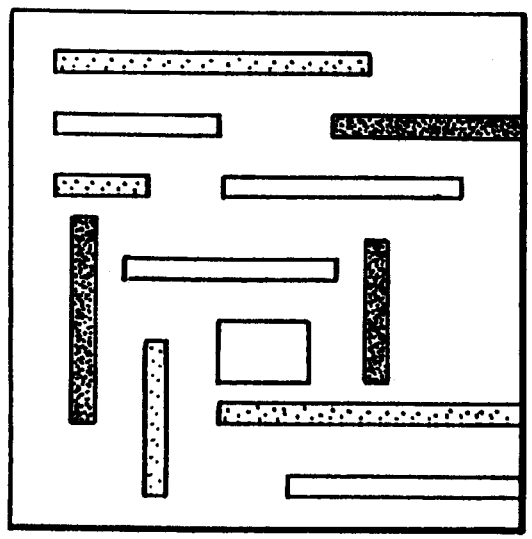
Fig. 7B
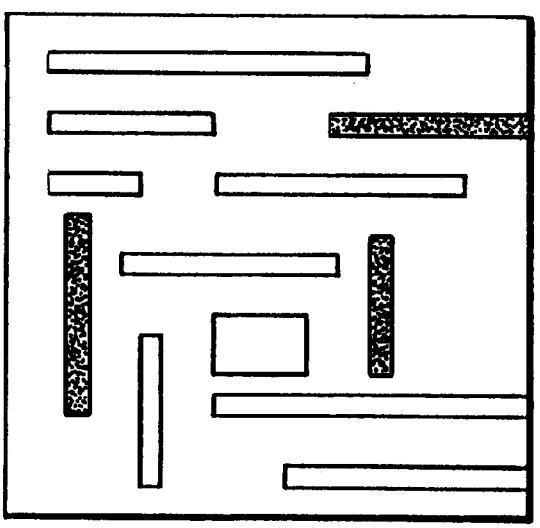

FAULT POINT ESTIMATING SYSTEM USING ABNORMAL CURRENT AND POTENTIAL CONTRAST IMAGES

BACKGROUND OF THE INVENTION

1. Field of the Invention

The present invention relates to a system for estimating a fault point in a semiconductor device such as a CMOS integrated device.

2. Description of the Related Art

In a first prior art system for estimating a semiconductor device, an electron beam tester is used to irradiate the semiconductor device with electrons, thus obtaining a potential contrast image from the semiconductor device. That is, potential contrast images for functional test patterns are stored and are compared with those of a non-defective semiconductor device. In this case, a determination of whether or not the device is defective is carried out by monitoring the output signals of the semiconductor device. If the semiconductor device is determined to be defective, the functional test patterns are retarded as decremental time sequences (see T. C. May et al., "Dynamic Fault Imaging of VLSI Random Logic Devices", IEEE/IRPS, pp.95–108, 1984).

In the first prior art system, however, unless the output signals of the semiconductor device are abnormal, it is impossible to substantially estimate a fault point in the semiconductor device. Also, comparison between potential contrast images of a tested semiconductor device and potential contrast images of a non-defective semiconductor device is required which increases the test time.

A second prior art system for estimating a fault point in a semiconductor device uses an optical emission microscope having a function for accumulating detected light (see: H. Ishizuka et al., "STUDY OF FAILURE ANALYSIS USING PHOTON SPECTRUM", REAJ 4-TH SYMPOSIUM, VoL. 13, No. 3, pp.71–76, November 1991).

In the second prior art system, however, if a fault point is beneath a conductive layer, it is impossible to detect light generated from such a fault point, since the light is reflected by the conductive layer. In addition, when a leakage current flowing through a fault point is so large as to remarkably increase the light intensity, it is impossible to normally operate the optical emission microscope.

SUMMARY OF THE INVENTION

It is an object of the present invention to easily and rapidly estimate a fault point in a semiconductor device.

According to the present invention, in a semiconductor device, a plurality of functional test patterns are generated and transmitted to the semiconductor device, and it is determined whether or not an abnormal current flows through the semiconductor device. Also, the semiconductor device is irradiated with electrons, and secondary electrons from the semiconductor device are detected. Potential contrast images are calculated in accordance with the detected secondary electrons in response to the functional test patterns. A logic operation is performed upon the potential contrast images to estimate a fault point.

Thus, according to the present invention, it is unnecessary to monitor the output signals of a tested semiconductor device. Also, comparision between potential contrast images of a tested semiconductor device and potential contast images of an acceptable semiconductor device is unnecessary.

BRIEF DESCRIPTION OF THE DRAWINGS

The present invention will be more clearly undersood from the description as set forth below, with reference to the accompanying drawings, wherein:

FIG. 3 is a block diagram illustrating an embodiment of the fault point estimating apparatus according to the present invention;

FIGS. 5A and 5B are cross-sectional views for explaining a method for obtaining an improved potential contrast image;

FIG. 7A is a diagram showing a potential contrast image of pixels having 8 gradation values;

FIG. 7B is a diagram showing a potential contrast image of pixels having 2 gradation values;

DESCRIPTION OF THE PREFERRED EMBODIMENT

First, a principle of the present invention will be explained with reference to FIGS. 1A, 1B, 2A and 2B.

Figures 1A, 1B:
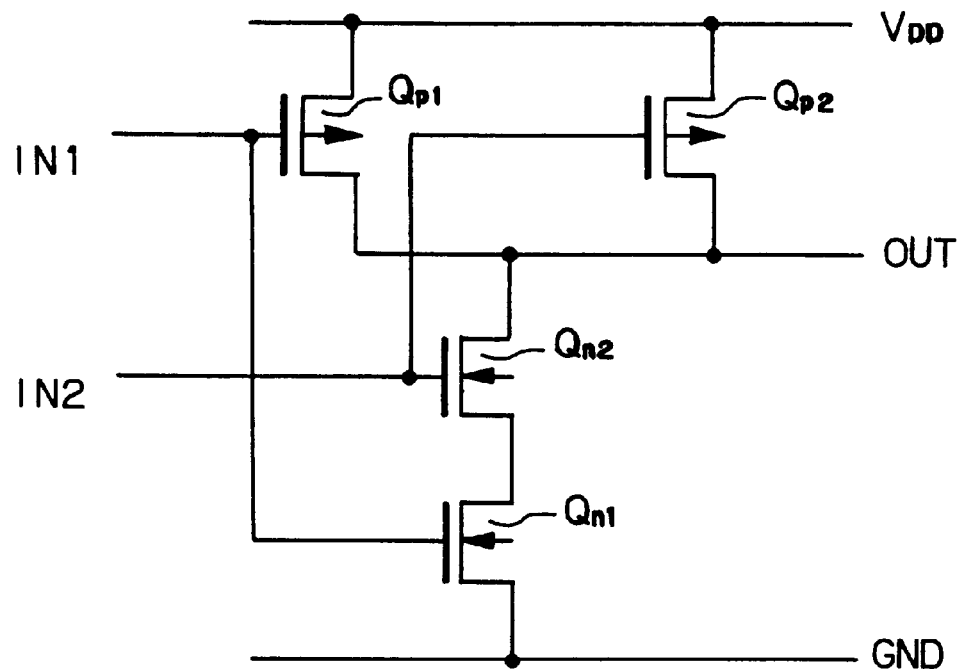
FIG. 1A is a circuit diagram illustrating a normal two-input CMOS NAND circuit.
FIG. 1B is a truth table of the circuit of FIG. 1A.

In FIG. 1A, which illustrates a normal two-input CMOS NAND circuit, P-channel MOS transistors $Q_{p1}$ and $Q_{p2}$ are connected in parallel between a power supply terminal $V_{DD}$ and an output terminal OUT, and N-channel MOS transistors $Q_{n1}$ and $Q_{n2}$ are connected in series between the output terminal OUT and a ground terminal GND. The transistors $Q_{p1}$ and $Q_{n1}$ are controlled by the voltage of an input terminal IN1, and the transistors $Q_{p2}$ and $Q_{n2}$ are controlled by the voltage of an input terminal IN2. The truth table of the NAND circuit of FIG. 1A is shown in FIG. 1B.

In FIG. 1A, there is no quiescent $V_{DD}$ supply current $I_{ddq}$ flowing from the power supply terminal $V_{DD}$ to the ground terminal GND. That is, the quiescent $V_{DD}$ supply current $I_{ddq}$ is in a normal state.

Figures 2A, 2B:
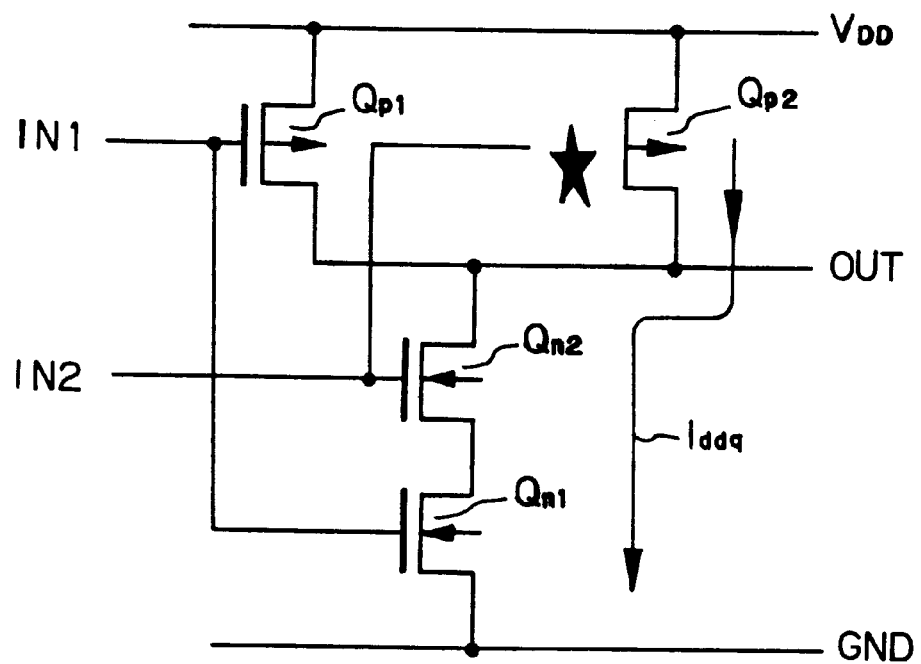
FIG. 2A is a circuit diagram illustrating an abnormal two-input CMOS NAND circuit.
FIG. 2B is a truth table of the circuit of FIG. 2A.

In FIG. 2A, which illustrates an abnormal two-input CMOS NAND circuit, assume that the gaLe of the P-channel transistor $Q_{p2}$ is open, so that the P-channel transistor $Q_{p2}$ is in a normally ON state. As a result, when the voltages at the input terminals IN1 and IN2 are both high, a penetration current, i.e., a large quiescent $V_{DD}$ supply current $I_{ddq}$ flows. That is, the quiescent $V_{DD}$ supply current $I_{ddq}$ is in an abnormal state.

Also, in FIG. 2A, when the voltages at the input terminals IN1 and IN2 are both high, the voltage $V_{OUT}$ at the output terminal OUT is $$V_{OUT}=V_{DD}\cdot(2Z_n)/(Z_p+2\cdot Z_n)>V_{th}$$

where $Z_p$ is an impedance of the P-channel transistor $Q_{p2}$;
$Z_n$ is an impedance of each of the N-channel transistors $Q_{n1}$ and $Q_{n2}$; and
$V_{th}$ is a logic threshold voltage of a CMOS inverter. If $Z_p=Z_n$, then $$V_{OUT}=(2/3)V_{DD}>V_{th}$$

Therefore, the truth table of the NAND circuit of FIG. 2A is shown in FIG. 2B.

Thus, generally, if a semiconductor device such as a CMOS device has a physical defect therein, an abnormal quiescent $V_{DD}$ supply current flows therethrough (see: M. Sanada, "New Application of Laser Beam to Failure Analysis of LSI with Multi-Metal Layers", Microelectronics and Reliability, Vol. 33, No. 7, pp. 993–1009, 1993, and M. Sanada, "Evalution and Detection of CMOS-LSI with Abnormal IDDQ", Microelectronics and Reliability, Vol. 35, No. 3, pp. 619–629, 1995).

In FIG. 3, which illustrates an embodiment of the fault point estimating apparatus according to the present invention, reference numeral 1 designates a semiconductor device such as a CMOS LSI device mounted in an electron beam tester 2. In more detail, the semiconductor device 1 is mounted on a device under test (DUT) board 21 which is fixed on an XY stage 22. The XY stage 22 is driven by a stage drive unit (not shown). In the electron beam tester 2, an electron beam is emitted from an electron gun 23 located at an upper portion of a mirror cylinder, and is irradiated onto the semiconductor device 1. As a result, secondary electrons are generated from the semiconductor device 1 and are detected by a secondary electron detector 24.

The semiconductor device 1 is supplied with a functional test pattern (FTP) via the DUT board 21. The functional test pattern is generated by a memory 3, a timing generating circuit 4, a pattern generating circuit 5, a format controller 6, and PIN electronics units 71, 72, . . . connected via the DUT board 21 to the semiconductor device 1.

The timing generating circuit 4 generates a timing signal for defining a test rate $T_O$, a delay time $T_D$ and a pulse width $T_W$. Also, the timing generating circuit 4 generates a strobe signal STB and transmits it to a current detector 9 for detecting a quiescent $V_{DD}$ supply current $I_{ddq}$ flowing from a power supply terminal $V_{DD}$ to a ground terminal GND in the semiconductor device 1.

The pattern generating circuit 5 generates an actual pattern signal in accordance with data read out of the memory 3 which is generally compressed.

Each of the PIN electronics units 71, 72, . . . is powered by voltages $V_H$ arid $V_L$ which are generated by digital/analog (D/A) converters 81 and 82, respectively. For example, when "0" is supplied to the PIN electronics unit 71, the voltage $V_L$ (=0 V) is applied to the corresponding input pad of the semiconductor device 1. When "1" is supplied to the PIN electronics unit 71, the voltage $V_H$ is applied to the corresponding input pad of the semiconductor device 1.

The memory 3 receives an address signal SADD from a control circuit 10 which is comprised of a central processing unit (CPU), ROMs, RAMs, and the like. Therefore, if the content ADD of the address signal SADD is incremented by the control circuit 10, functional test patterns are sequentially generated and are transmitted to the semiconductor device 1.

Simultaneously, the control circuit 10 monitors a quiescent $V_{DD}$ supply current $I_{ddq}$ flowing through the semiconductor device 1 by the current detector 9.

Further, connected to the control circuit 10 are an input apparatus 11 such as a keyboard or other controllers, and an output apparatus 12 such as a CRT.

When a functional test pattern FTP is supplied to the semiconductor device 1, a potential contrast image is obtained by performing a digital process upon the output of the secondary electron detector 24. For example, the potential contrast image is represented by pixels having 256 (=$2^8$) gradations between a high voltage such as 5 V and a low voltage such as 0 V.

Figure 4:
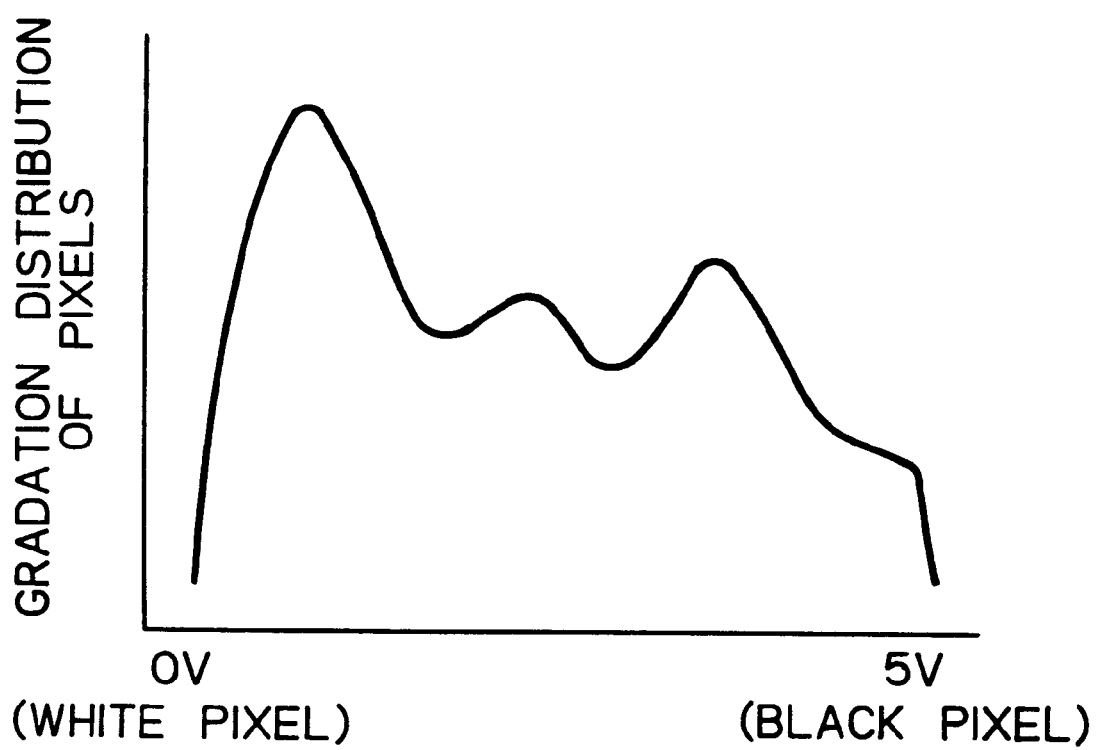
FIG. 4 is a graph showing an example of a gradation distribution of pixels.

The gradation values of the pixels are generally caused to fluctuate by the nonuniformity of insulating layers, the charge-up phenomenon of electrons at edges of patterns, and the charge-up phenomenon of electrons in the insulating layers. As a result, as shown in FIG. 4, the gradation of pixels are distributed entirely from a minimum gradation value (=0 V) to a maximum gradation value (=5 V). In this case, there are many pixels of intermediate (gray) gradation values, and accordingly, it is actually difficult to perform a logic operation upon the potential contrast image.

Note that, when the number of secondary electrons is increased, the pixel therefor is white (see 0 V). On the other hand, when the number of secondary electrons is decreased, the pixel therefor is black (see 5 V).

Figure 6A:
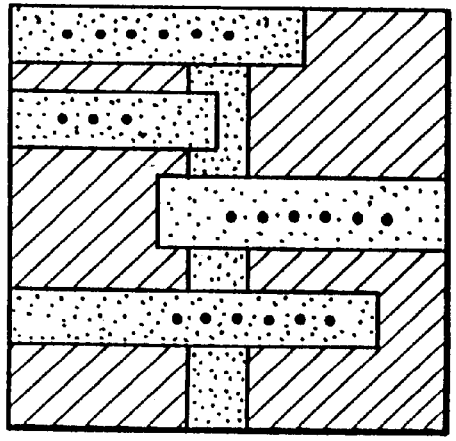
FIGS. 6A, 6B arid 6C are pattern views for explaining a method for obtaining an improved potential contrast image.
Figure 6B:
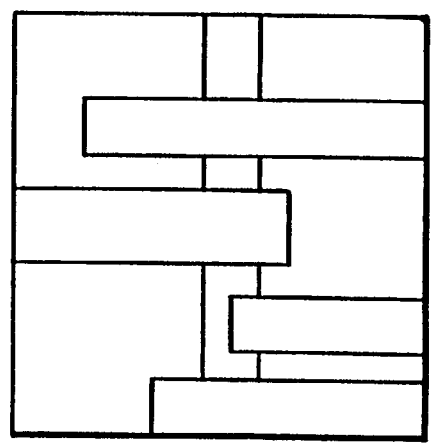
Figure 6C:
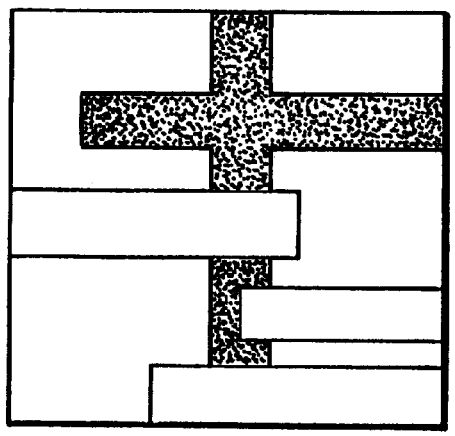

In order to obtain a potential contrast image depending upon only the conductive layers of the semiconductor device 1, one approach is to remove only insulating layers of the semiconductor device 1 in advance by using a plasma anisotropic etching process such as a reactive ion etching process, as shown in FIGS. 5A and 5B. In FIGS. 5A and 5B, reference numeral 501 designates a semiconductor substrate, 502 designates a conductive layer, and 503 an insulating layer. That is, when the plasma anisotropic etching process is performed upon the semiconductor device of FIG. 5A, the semiconductor device of FIG. 5B is obtained without inviting electrical destruction. In this case, a clear potential contrast image showing the potentials at the conductive layers can be obtained by pixels having 8 ($=2^3$) gradations In order to obtain a potential contrast image depending only the conductive layers of the semiconductor device 1, another approach is to calculate correlation values between a potential contrast image obtained by the output of the secondary electron detector 24 as shown in FIG. 6A and conductive layer layout information as shown in FIG. 6B to generate a potential contrast image depending upon only the conductive layers as shown in FIG. 6C.

In the embodiment of the present invention, an improved potential contrast image of pixels having 8 ($=2^3$) gradation values as shown in FIG. 7A is calculated from the output of the secondary electron detector 24 based upon one of the above-described two approaches, and then, the improved potential contrast image is converted into a potential contrast image of pixels having 2 gradation values as shown In FIG. 7B where the pixels of gray gradiation values are caused to be white pixels (low potential pixels).

In the embodiment of the present invention, (−1) is given to a black pixel and (+1) is given to a white pixel. Also, (0) is given to a meaningless pixel. In addition, any operation result is guarded by the minimum value (−1) and the maximum value (+1).

Figure 8A:
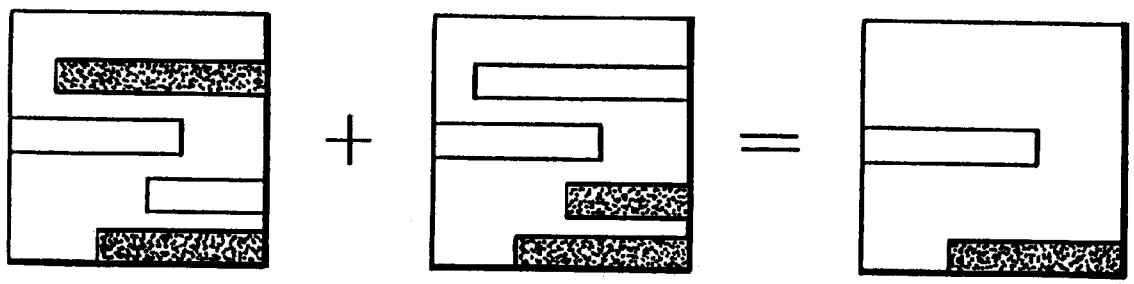
FIG. 8A is a diagram showing an adding operation between two potential contrast images according to the present invention.

Thus, in the present invention, an adding logic operation as shown in FIG. 8A is performed upon two potential contrast images as defined by:

(black pixel)+(black pixel)
 =(−1)+(−1)
 =(−2)=(−1)
 =(black pixel)
(black pixel)+(white pixel)
 =(−1)+(+1)
 =(0)(meaningless pixel)
(white pixel)+(black pixel)
 =(+1)+(−1)
 (0)(meaningless pixel)
(white pixel)+(white pixel)
 (+1)+(+1)
 (+2)=(+1)
 =(white pixel)

Thus, in FIG. 8A, common pixels between the two potential contrast images are obtained.

Figure 8B:
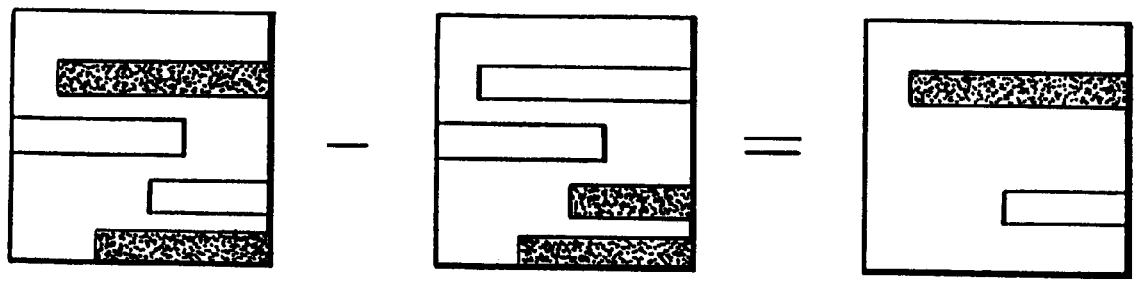
FIG. 8B is a diagram showing a subtracting operation between two potential contrast images according to the present invention.

Also, in the embodiment of the present invention, a subtracting logic operation as shown in FIG. 8B is performed upon two potential contrast images as defined by:

(black pixel)−(black pixel)
 =(−1)−(−1)
 =(0)(meaningless pixel)
(black pixel)−(white pixel)
 =(−1)−(−1)
 =(−2)=(−1)
 =(black pixel)
(white pixel)−(black pixel)
 =(+1)−(−1)
 =(+2)=(+1)
 =(white pixel)

(white pixel)−(white pixel)
 =(+1)−(+1)
 =(0)(meaningless pixel)

Thus, in FIG. 8B, different pixels between the two potential contrast images are obtained.

In the above-mentioned adding and subtracting operations, note that, when any operation is performed upon at least one meaningless pixel, an obtained pixel is meaningless as defined by:

(meaningless pixel)+(black pixel)
 =(0)+(−1)
 =(0)(meaningless pixel)
(meaningless pixel)+(white pixel)
 =(0)+(+1)
 =(0)(meaningless pixel)
(black pixel)+(meaningless pixel)
 =(−1)+(0)
 =(0)(meaningless pixel)
(white pixel)+(meaningless pixel)
 =(+1)+(0)
 =(0)(meaningless pixel)
(meaningless pixel)+(meaningless pixel)
 =(0)+(0)
 =(0)(meaningless pixel)
(meaningless pixel)−(black pixel)
 =(0)−(−1)
 =(0)(meaningless pixel)
(meaningless pixel)−(white pixel)
 =(0)−(+1) =(0)(meaningless pixel)
(black pixel)−(meaningless pixel)
 =(0)(meaningless pixel) =(0)(meaningless pixel)
(white pixel)−(meaningless pixel)
 =(+1)−(0)
 =(0)(meaningless pixel)
(meaningless pixel)−(meaningless)
 =(0)−(0)
 =(0)(meaningless pixel)

Figure 9:
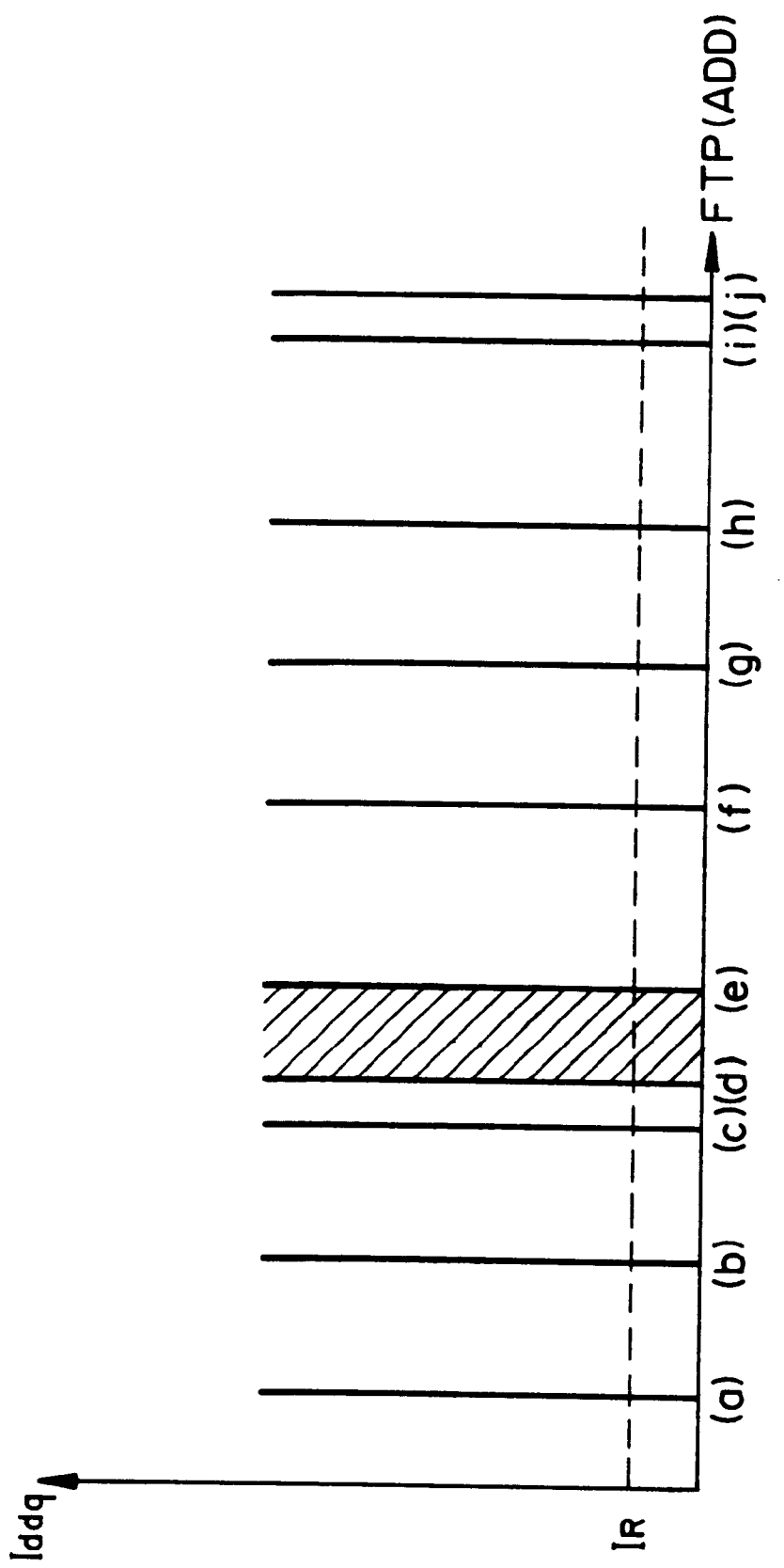
FIG. 9 is a diagram showing an example of a relationship between a quiescent $V_{DD}$ supply current and a functional test pattern.

In FIG. 9, which is a graph showing an example of a relationship between a quiescent $V_{DD}$ supply current $I_{ddq}$ and a functional test pattern FTP, only at functional test patterns FTP(a), FTP(b), FTP(c), FTP(d), ..., FTP(e), ..., does a quiescent $V_{DD}$ supply current $I_{ddq}$ ($>I_R$), i.e., an abnormal current flow through the semiconductor device 1.

Figure 10:
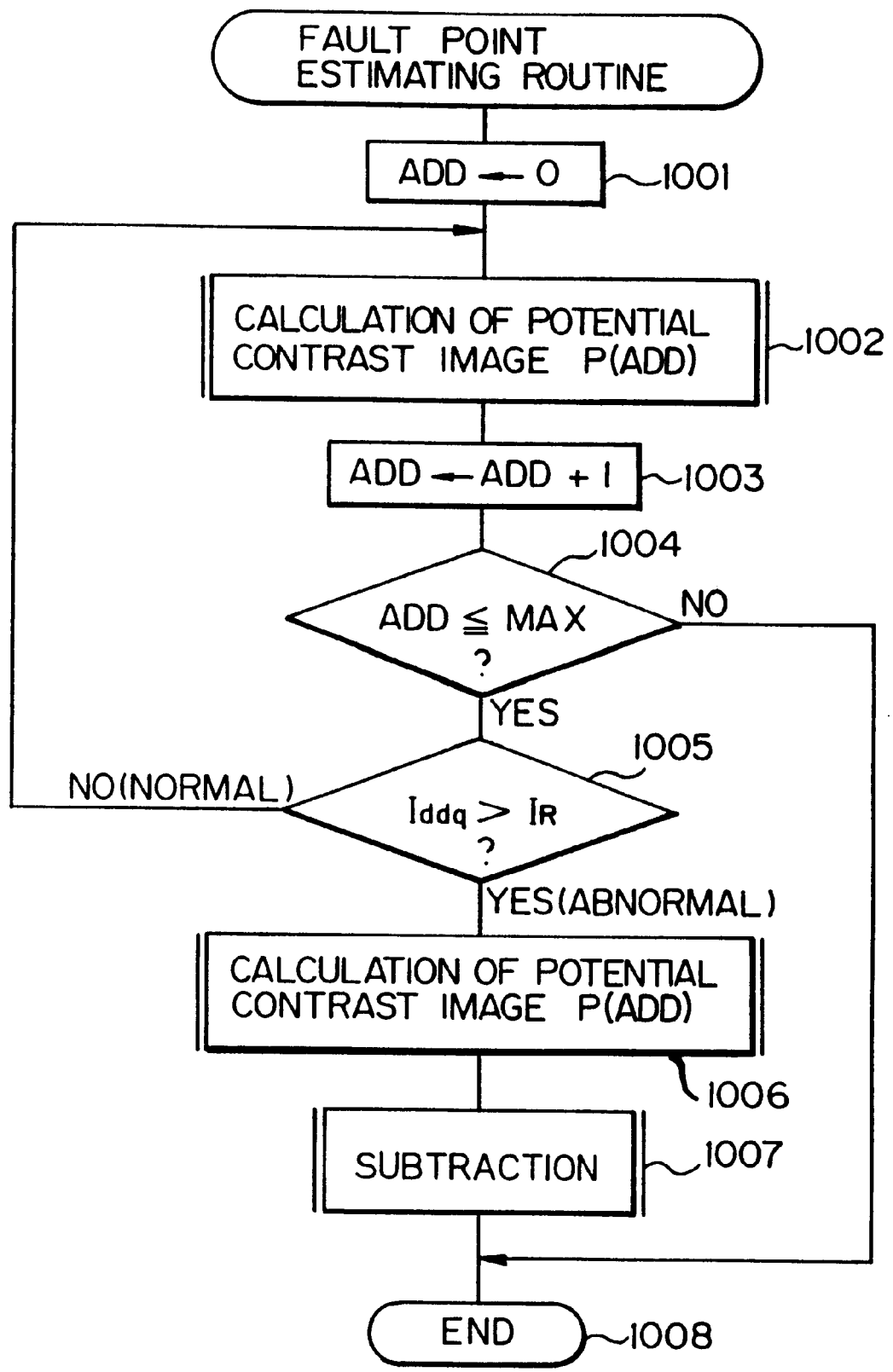
FIG. 10 is a flowchart showing a first operation of the control circuit 10 of FIG. 3.
Figure 11:
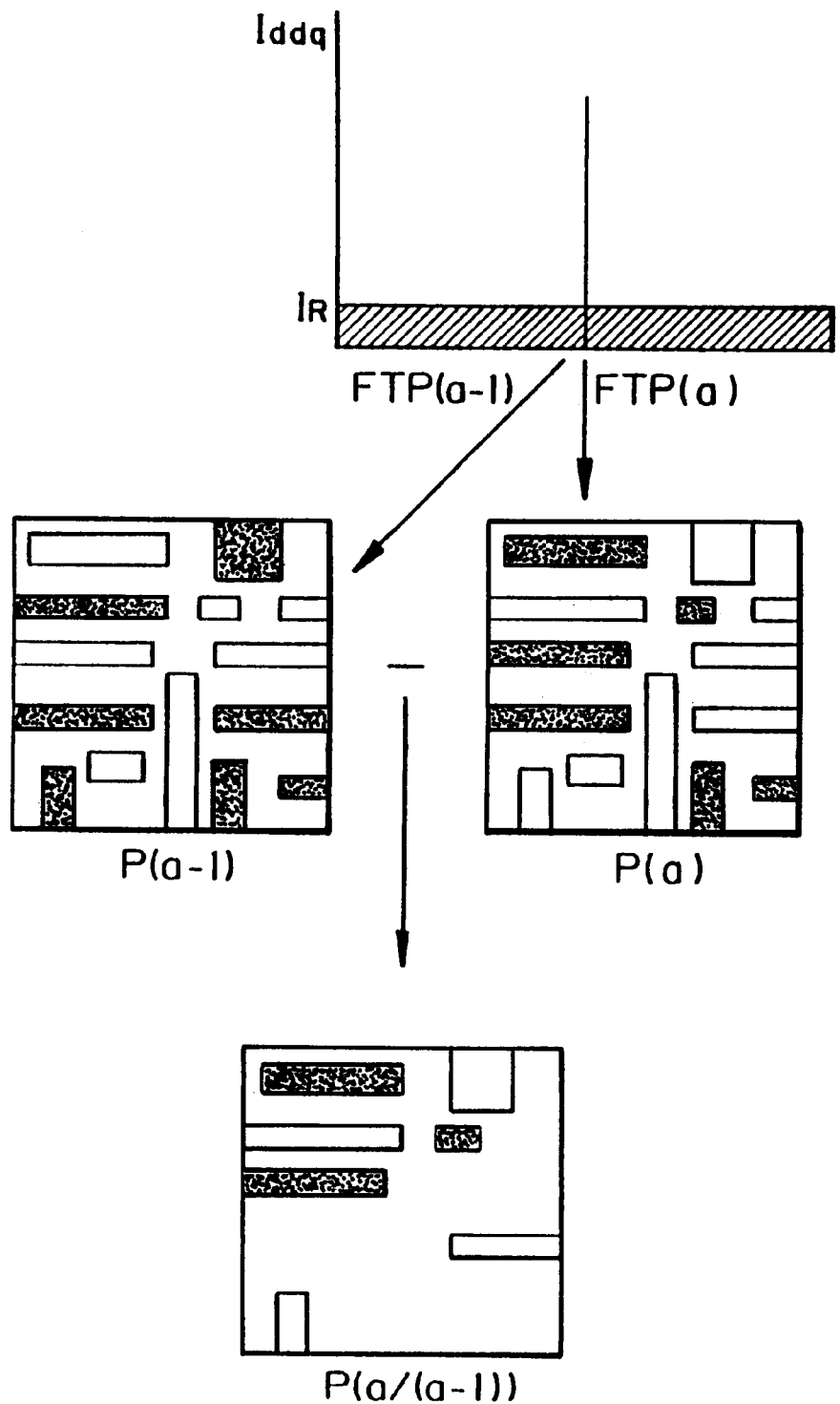
FIG. 11 is a diagram for explaining the flowchart of FIG. 10.

FIG. 10 is a flowchart showing a first operation of the control circuit 10 of FIG. 3, and FIG. 11 is a diagram for explaining the flowchart of FIG. 10.

First, at step 1001, the address ADD is cleared.

Next, at step 1002, a potential contrast image P(ADD) is calculated in accordance with the output of the secondary electron detector 24.

Next, steps 1003 and 1004 repeat the operation at steps 1002 and 1005 until ADD reaches its maximum value MAX.

At step 1005, it is determined whether or not $I_{ddq}>I_R$ (definite value) is satisfied. If $I_{ddq} \leq I_R$, which means that the quiescent $V_{DD}$ supply current $I_{ddq}$ is normal, the control returns to step 1002. On the other hand, if $I_{ddq}>I_R$, which means that the quiescent $I_{DD}$ supply current $I_{ddq}$ is abnormal, the control proceeds to step 1006. That is, as shown in FIG. 11, at the functional test pattern FTP(a), the quiescent $I_{DD}$ supply current $I_{ddq}$ is switched from normal to abnormal.

At step 1006, a potential contrast image P(ADD) is calculated in accordance with the output of the secondary electron detector 24.

Note that, as shown in FIG. 11, tile potential contrast image P(a−1) is already calculated at step 1002, and the potential control image P(a) is already calculated at step 1006.

Next, at step 1007, a subtracting operation is performed upon the two potential contrast images P(a) and P(a−1) to obtain a potential contast image P(a/a−1) defined by P(a/a−1)
=P(a)−P(a−1)

Then, the routine of FIG. 10 is completed by step 1008.

Thus, the potential contrast image such as P(a/(a−1)) including fault points can be obtained.

Figure 12:
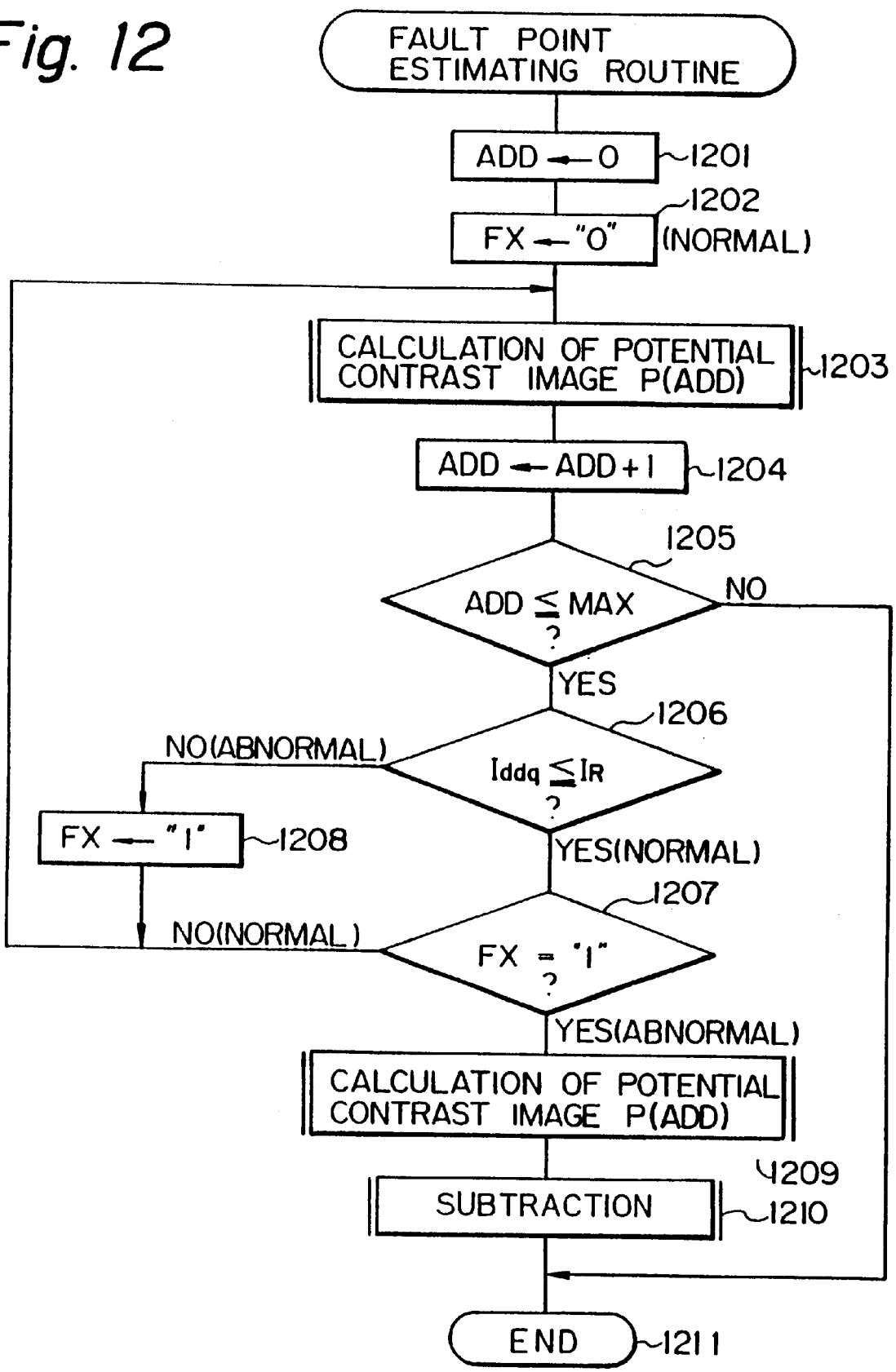
FIG. 12 is a flowchart showing a second operation of the control circuit 10 of FIG. 3.
Figure 13:
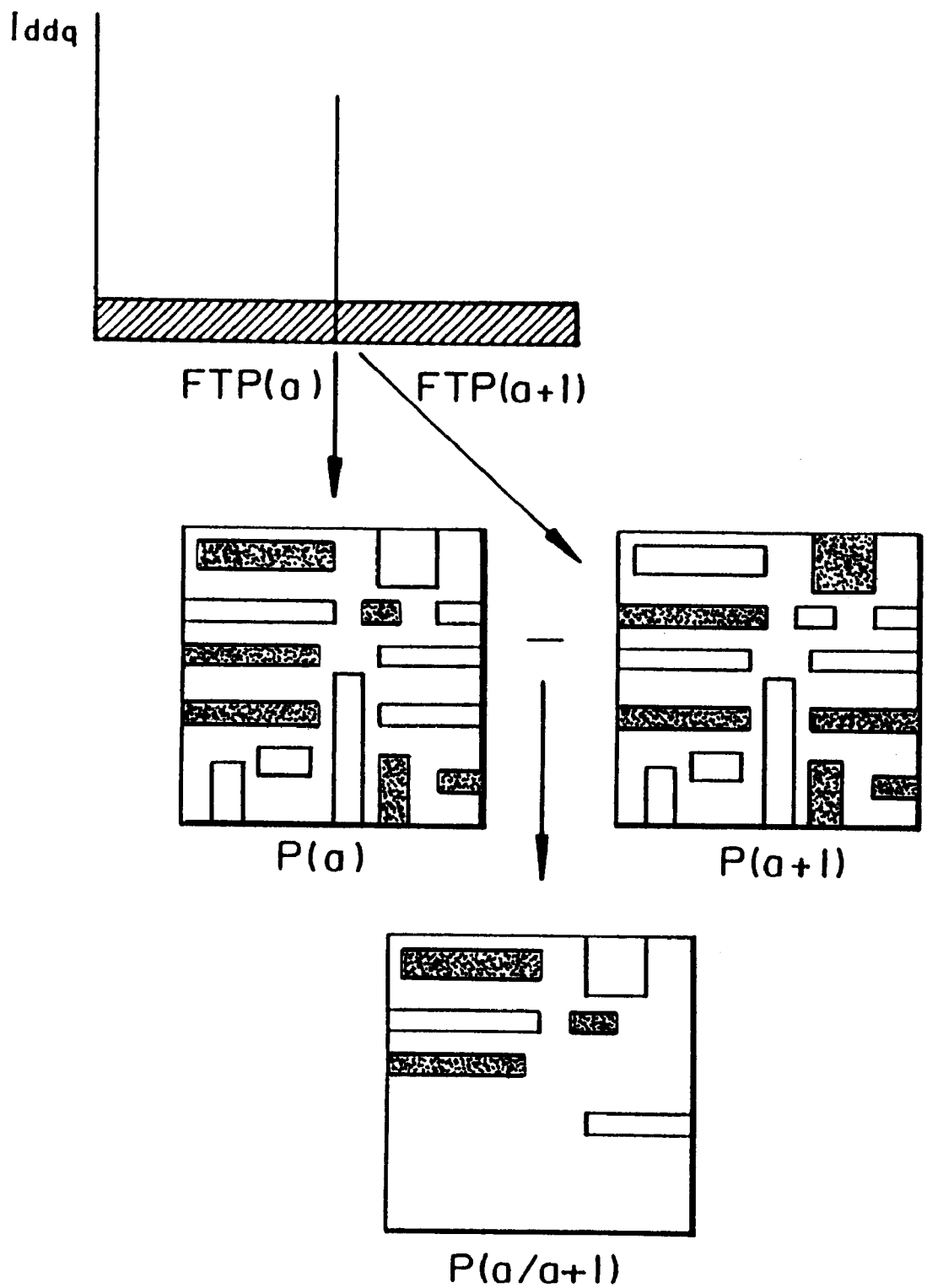
FIG. 13 is a diagram for explaining the flowchart of FIG. 12.

FIG. 12 is a flowchart showing a second operation of the control circuit 10 of FIG. 3, and FIG. 13 is a diagram for explaining the flowchart of FIG. 12.

First, at step 1201, the address ADD is cleared. Also, at step 1202, a flag FX is reset (FX="0") to show that the current quiescent $I_{DD}$ supply current $I_{ddq}$ is normal. Note that FX="0" means that the quiescent $V_{DD}$ supply current $I_{ddq}$ is normal, and FX="1" means that the quiescent $V_{DD}$ supply current $I_{ddq}$ is abnormal.

Next, at step 1203, a potential contrast image P(ADD) is calculated in accordance with the output of the secondary electron detector 24.

Next, steps 1204 and 1205 repeat the operation at steps 1203 and 1206, 1207 and 1208 until ADD reaches its maximum value MAX.

At step 1206, it is determined whether or not $I_{ddq}>I_R$ is satisfied. If $I_{ddq}\leq I_R$ (normal), the control proceeds to step 1207. On the other hand, if $I_{ddq}>I_R$ (abnormal), the control proceeds to step 1208. That is, as shown in FIG. 13, at the functional test patterns FTP(a−2), and FTP(a−1), since $I_{ddq}\leq I_R$ and FX="0", the control returns via step 1207 to step 1203. Also, at the functional test pattern FTP(a), since $I_{ddq}>I_R$, the control proceeds to step 1208 which sets the flag FX (FX="1"). Further, at the functional test pattern FTP(a+1), since $I_{ddq}\leq I_R$ and FX="1", i.e., the quiescent $I_{DD}$ supply current $I_{qqd}$ is switched from abnormal to normal, the control proceeds via step 1207 to step 1209.

At step 1209, a potential contrast image P(ADD) is calculated in accordance with the output of the secondary electron detector 24.

Note that, as shown in FIG. 13, the potential contrast image P(a) is already calculated at step 1203, and the potential control image P(a+1) is already calculated at step 1209.

Next, at step 1210, a subtracting operation is performed upon the two potential contrast images P(a) and P(a+1) to obtain a potential contast image P(a/a+1) defined by P(a/a+1)
P(a)−P(a+1)

Then, the routine of FIG. 12 is completed by step 1211.

Thus, the potential contrast image such as P(a/(a+1)) including fault points can be obtained.

Figure 14A:
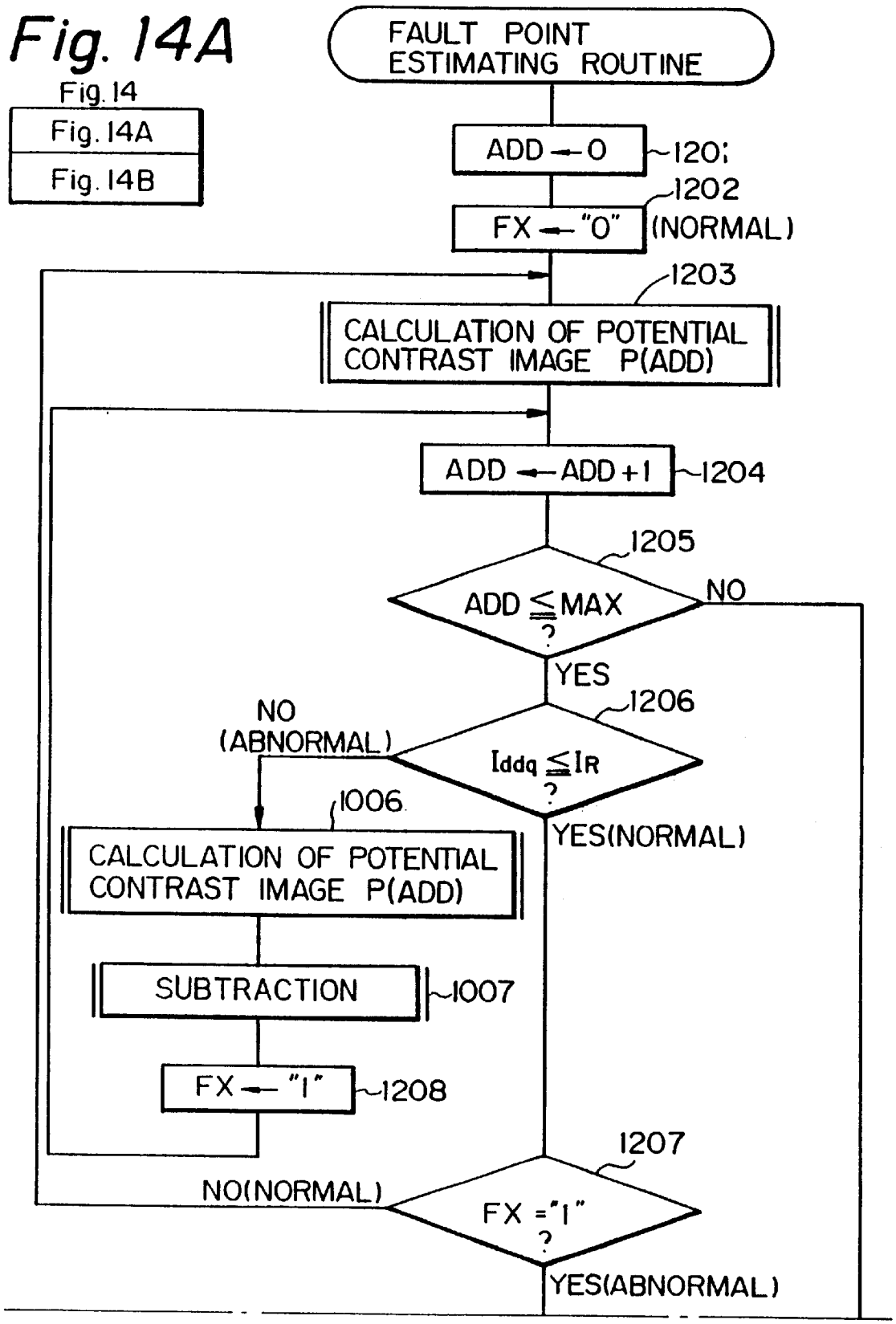
FIGS. 14A and 14B are a flowchart showing a third operation of the control circuit 10 of FIG. 3.
Figure 14B:
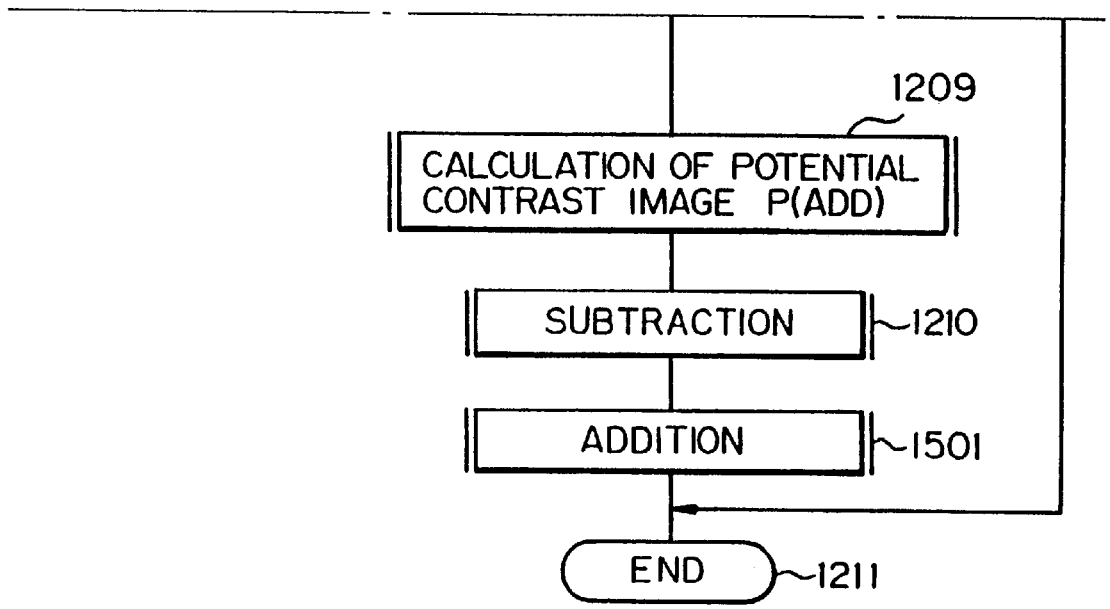
Figure 15:
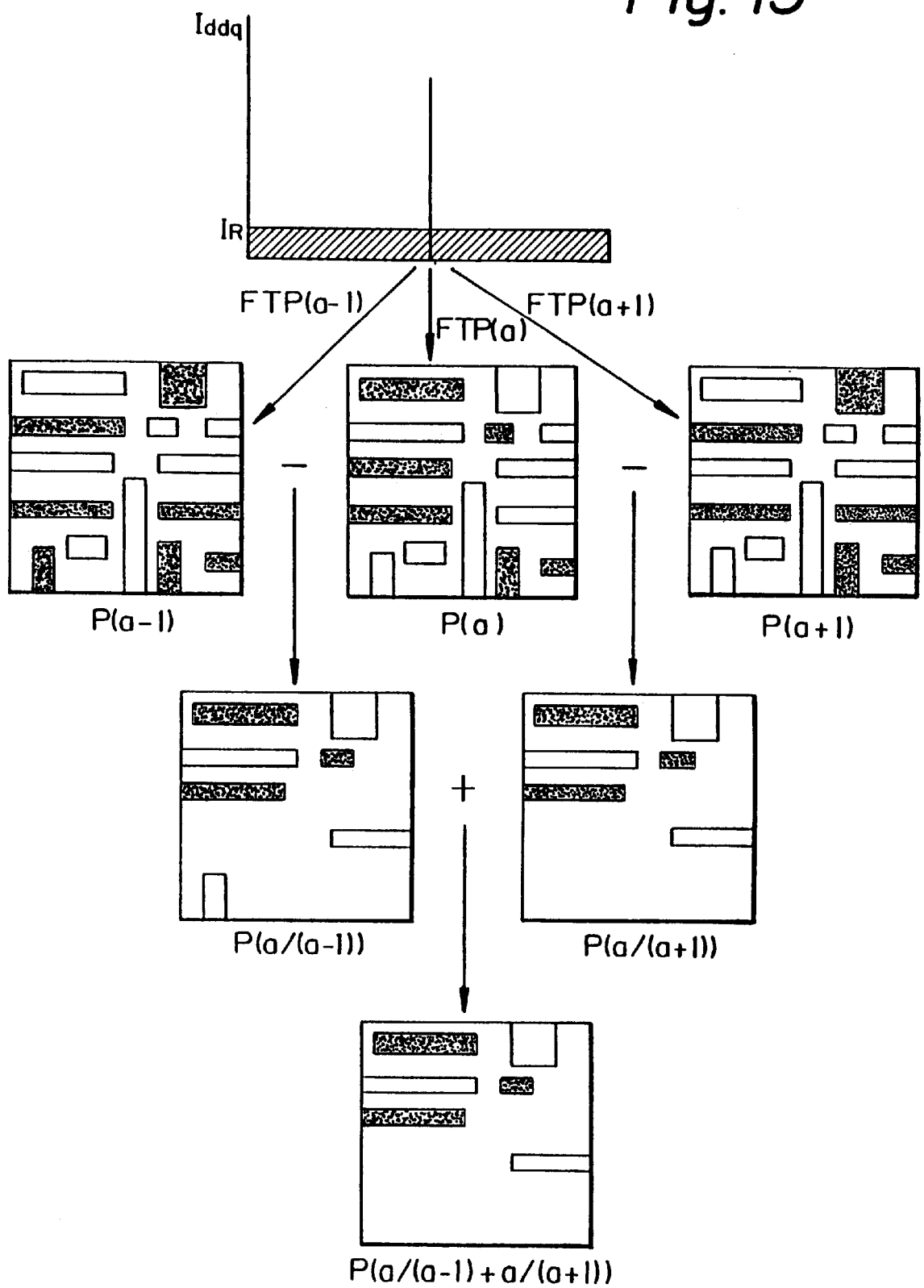
FIG. 15 is a diagram for explaining the flowchart of FIG. 14A and 14B.

FIGS. 14A and 14B are a flowchart showing a third operation of the control circuit 10 of FIG. 3, and FIG. 15 is a diagram for explaining the flowchart of FIGS. 14A and 14B.

In FIGS. 14A and 14B, the first operation of FIG. 10 is combined with the second operation of FIG. 12. That is, steps 1006 and 1007 are introduced into the flowchart of FIG. 12. Also, a step 1501 is added to perform an adding operation upon the potential contrast images P(a/a−1) and P(a/a+1) as shown in FIG. 15.

First, at step 1201, the address ADD is cleared. Also, at step 1202, a flag FX is reset (FX="0") to show that the current quiescent $I_{DD}$ supply current $I_{ddq}$ is normal.

Next, at step 1203, a potential contrast image P(ADD) is calculated in accordance with the output of the secondary electron detector 24.

Next, steps 1204 and 1205 repeat the operation at step 1006, 1007, 1203 and 1206, 1207 and 1208 until ADD reaches its maximum valise MAX.

At step 1206, it is determined whether or not $I_{ddq}>I_R$ is satisfied. If $I_{ddq}\leq I_R$ (normal), the control proceeds to step 1207. On the other hand, if $I_{ddq}>I_R$ (abnormal), the control proceeds to step 1006, 1007 and 1208. That is, as shown in FIG. 15, at the functional test patterns FTP(a−2), and FTP(a−1), since $I_{ddq}\leq I_R$ and FX="0", the control returns via step 1207 to step 1203. Also, at the functional test pattern FTP(a), since $I_{ddq}>I_R$, the control proceeds to steps 1006, 1007 and 1208.

At step 1006, a potential contrast image P(ADD) is calculated in accordance with the output of the secondary electron detector 24.

Note that, as shown in FIG. 15, the potential contrast image P(a−1) is already calculated at step 1203, and the potential control image P(a) is already calculated at step 1006.

Next, at step 1007, a subtracting operation is performed upon the two potential contrast images P(a) and P(a−1) to obtain a potential contast image P(a/a−1) defined by P(a/a−1)
P(a)−P(a−1)

At step 1208, the flag FX is set (FX="1").

Further, at the functional test pattern FTP(a+1) since $I_{ddq}\leq I_R$ and FX="1", i.e., the quiescent $I_{DD}$ supply current $I_{qqd}$ is switched from abnormal to normal, the control proceeds via step 1207 to step 1209.

At step 1209, a potential contrast image P(ADD) is calculated in accordance with the output of the secondary electron detector 24.

Note that, as shown in FIG. 15, the potential contrast image P(a) is already calculated at step 1009, and the potential control image P(a+1) is already calculated at step 1209.

Next, at step 1210, a subtracting operation is performed upon the two potential contrast images P(a) and P(a+1) to obtain a potential contast image P(a/a+1) defined by P(a/a+1)
P(a)−P(a+1)

Next, at step 1501, an adding operation is performed upon the two potential contrast images P(a/(a−1)) and P(a/(a+1)) to obtain a potential contrast image P(a/(a−1)+(a/(a+1)) defined by P(a/(a−1)+a/(a+1))
=P(a/(a−1))+P(a/(a+1))

Then, the routine of FIGS. 14A and 14B is completed by step 1211.

Thus, the potential contrast image such as P(a/(a−1)+a/(a+1)) including fault points can be obtained.

As shown in FIGS. 11,13 and 15, the estimation of fault points in the third operation as shown in FIGS. 14A and 14B is superior to those in the first and second operations as shown in FIGS. 10 and 12.

Figure 16:
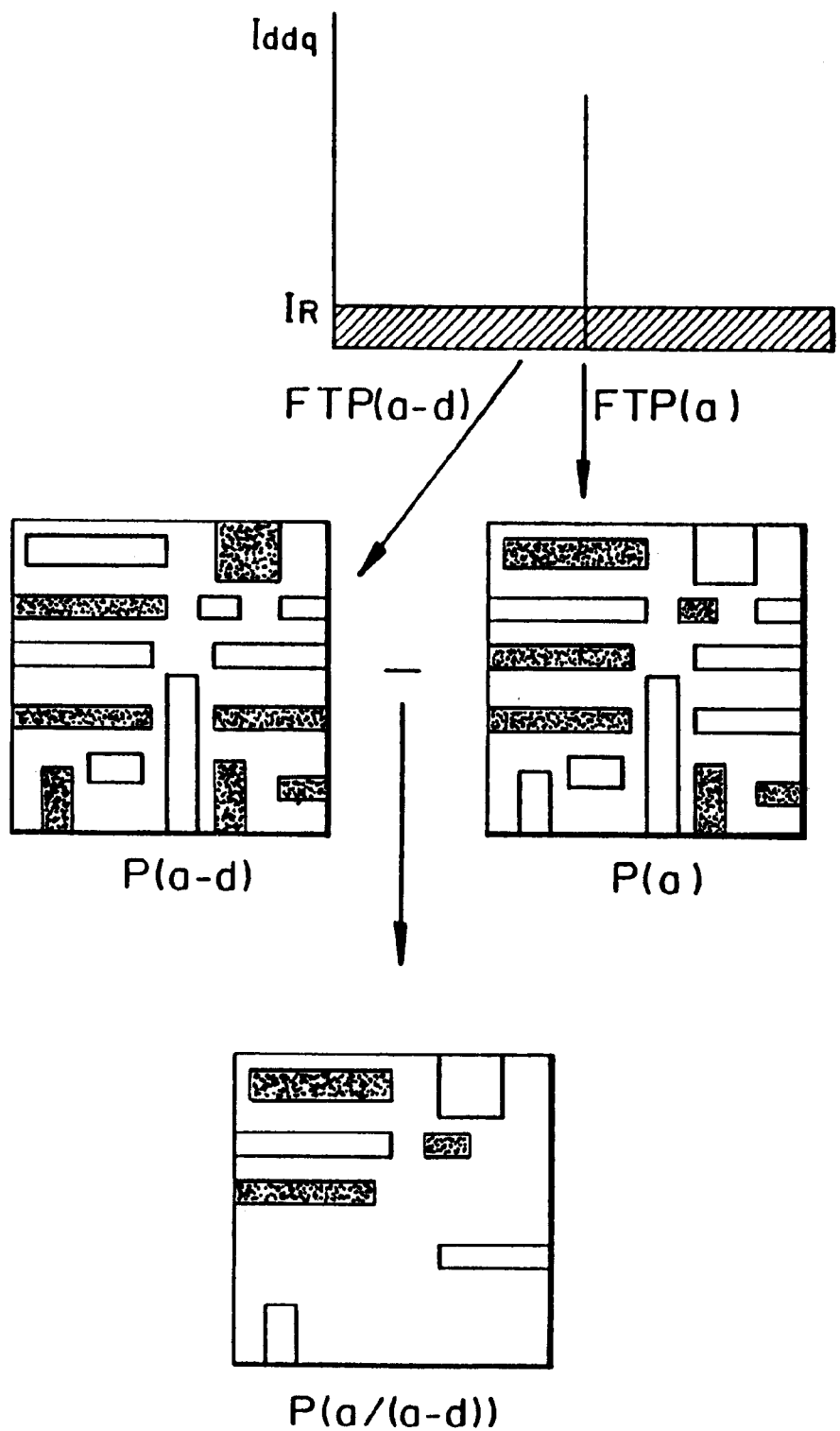
FIG. 16, 17 and 18 are diagrams illustrating modifications of the diagrams of FIGS. 11, 13 and 15, respectively.
Figure 17:
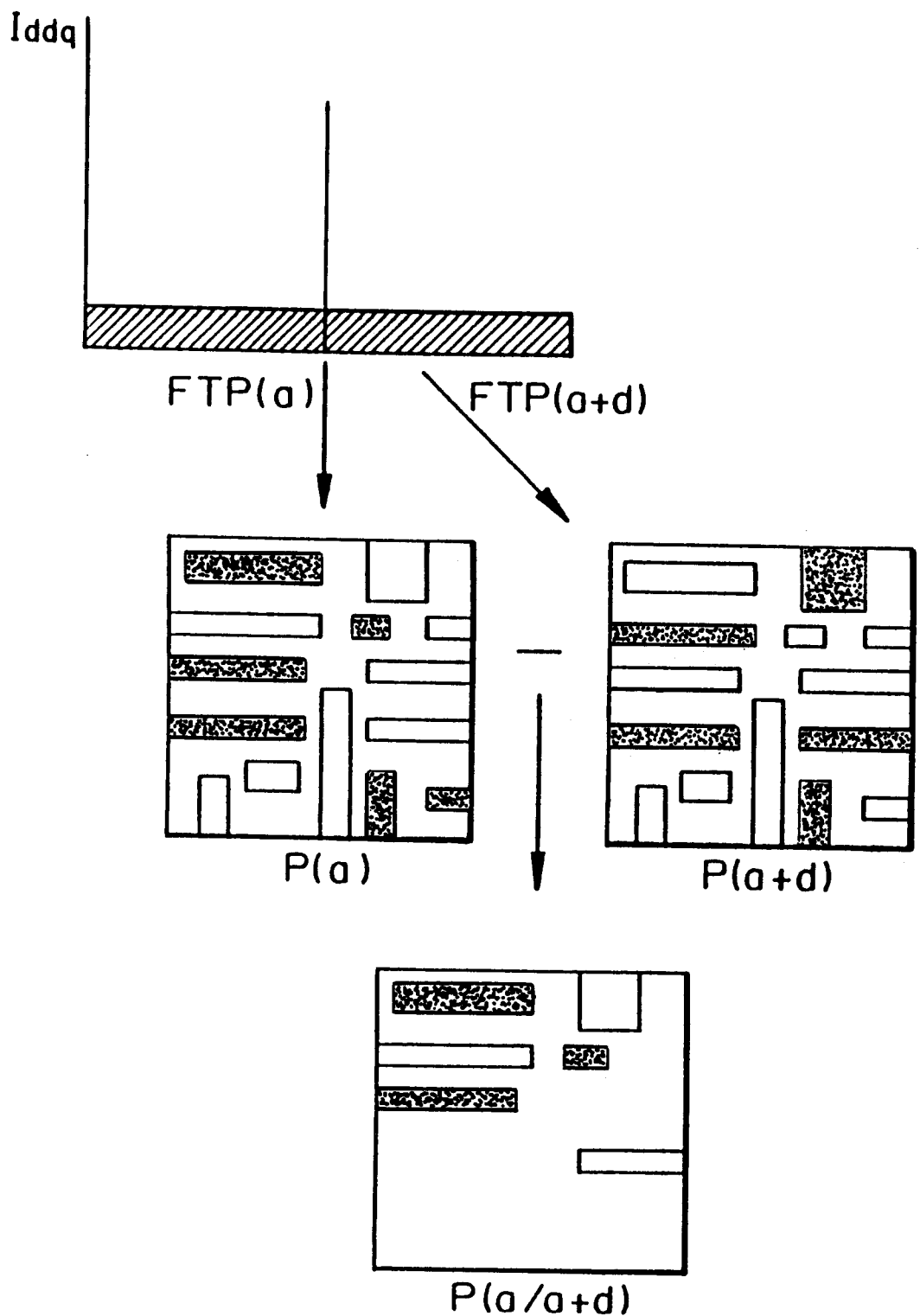
Figure 18:
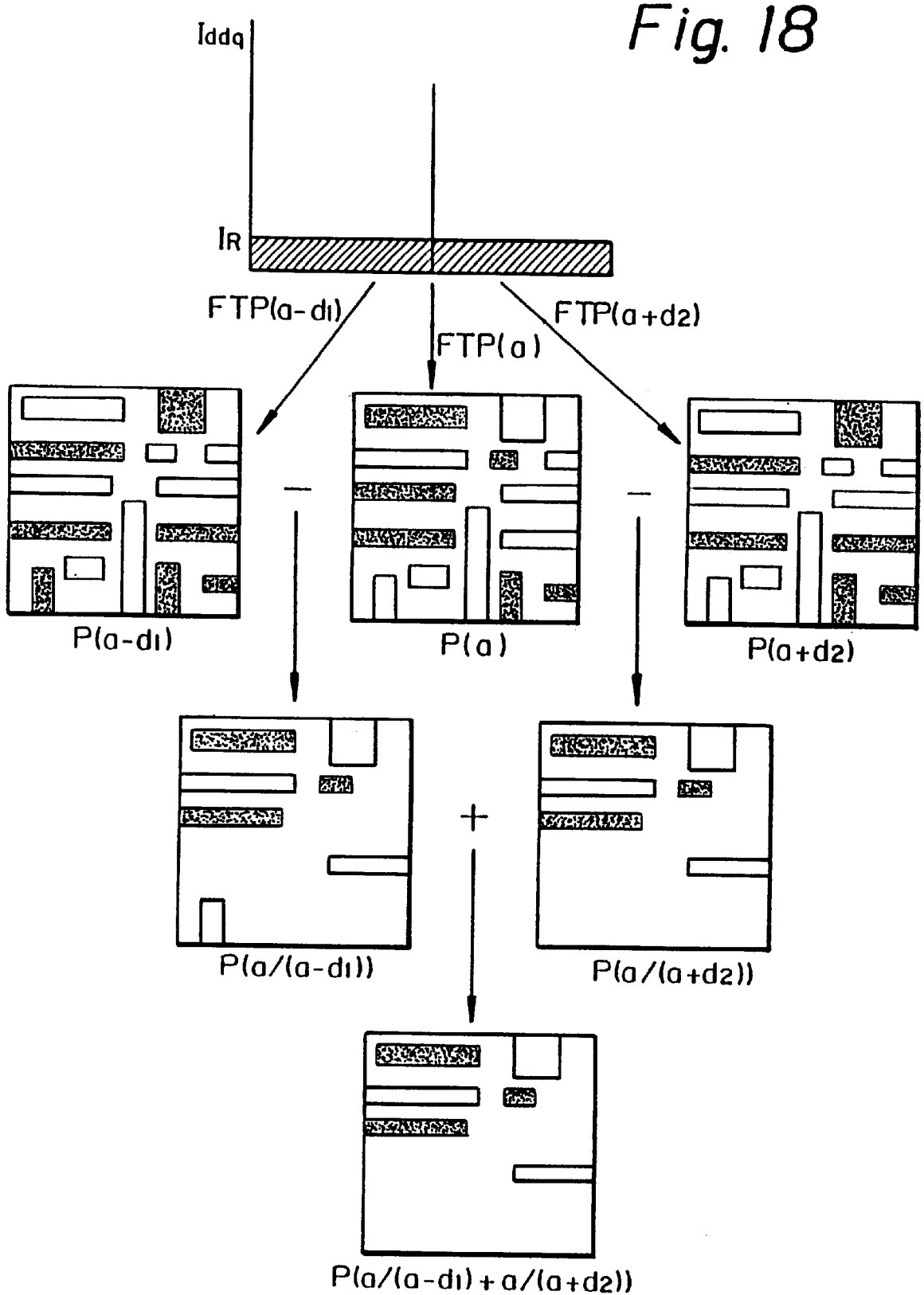

In FIGS. 10, 12, 14A and 14B, although a subtracting operation is performed upon a potential contrast image P(a) based upon the detection of an abnormal current and its immediately neighboring potential contrast image P(a−1) or P(a+1), it is possible to perform a subtracting operation upon the potential contrast image P(a) and a potential contrast image P(a−d) as shown in FIG. 16 P(a+d) as shown in FIG. 17, or P(a−d1) and P(a+d2) as shown in FIG. 18. In this case, the values d, d1 and d2 are larger than 1. Note that FIGS. 16, 17 and 18 are modifications of FIGS. 11, 13 and 15, respectively.

Figure 19:
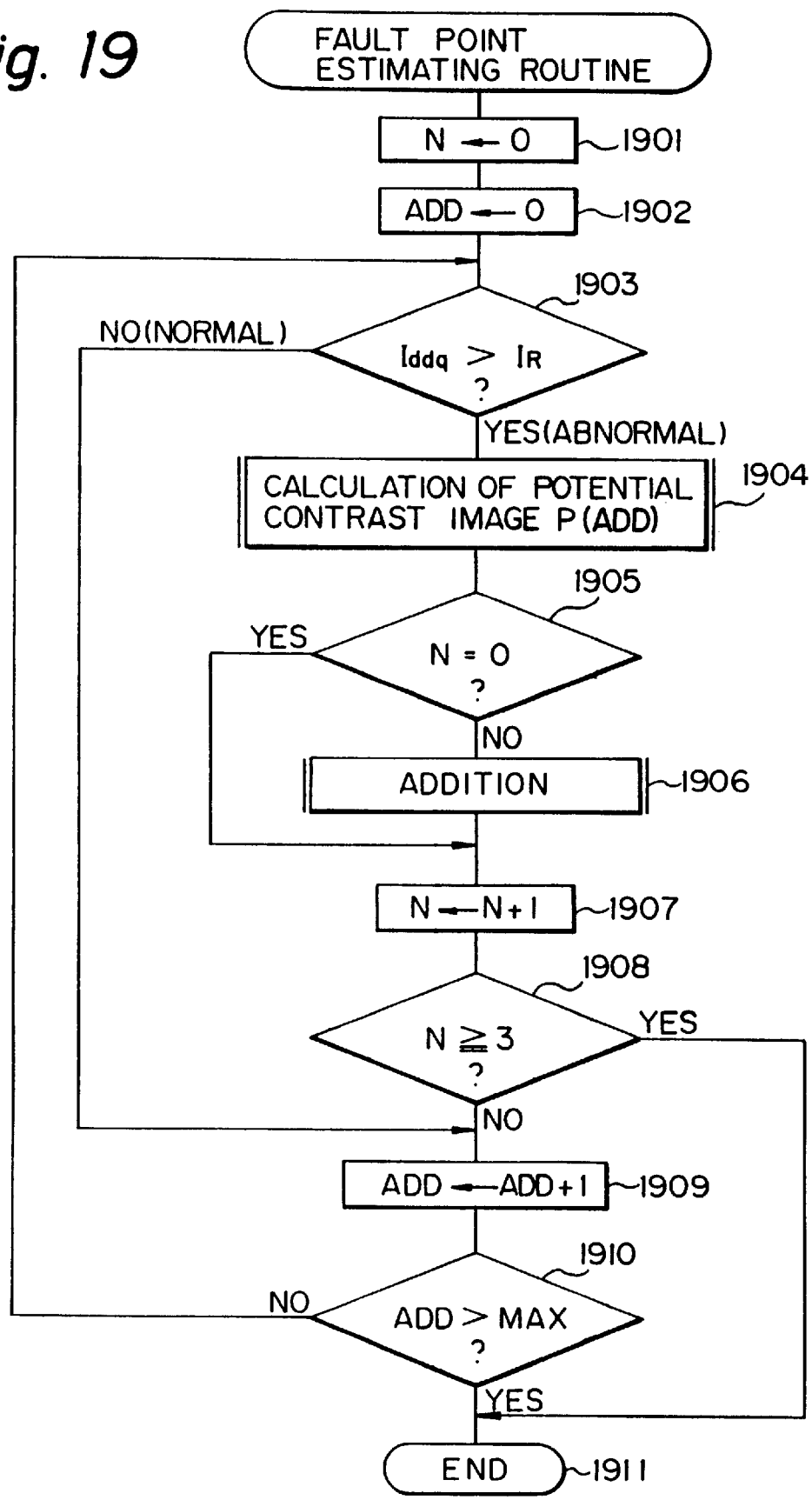
FIG. 19 is a flowchart showing a fourth operation of the control circuit 10 of FIG. 3.
Figure 20:
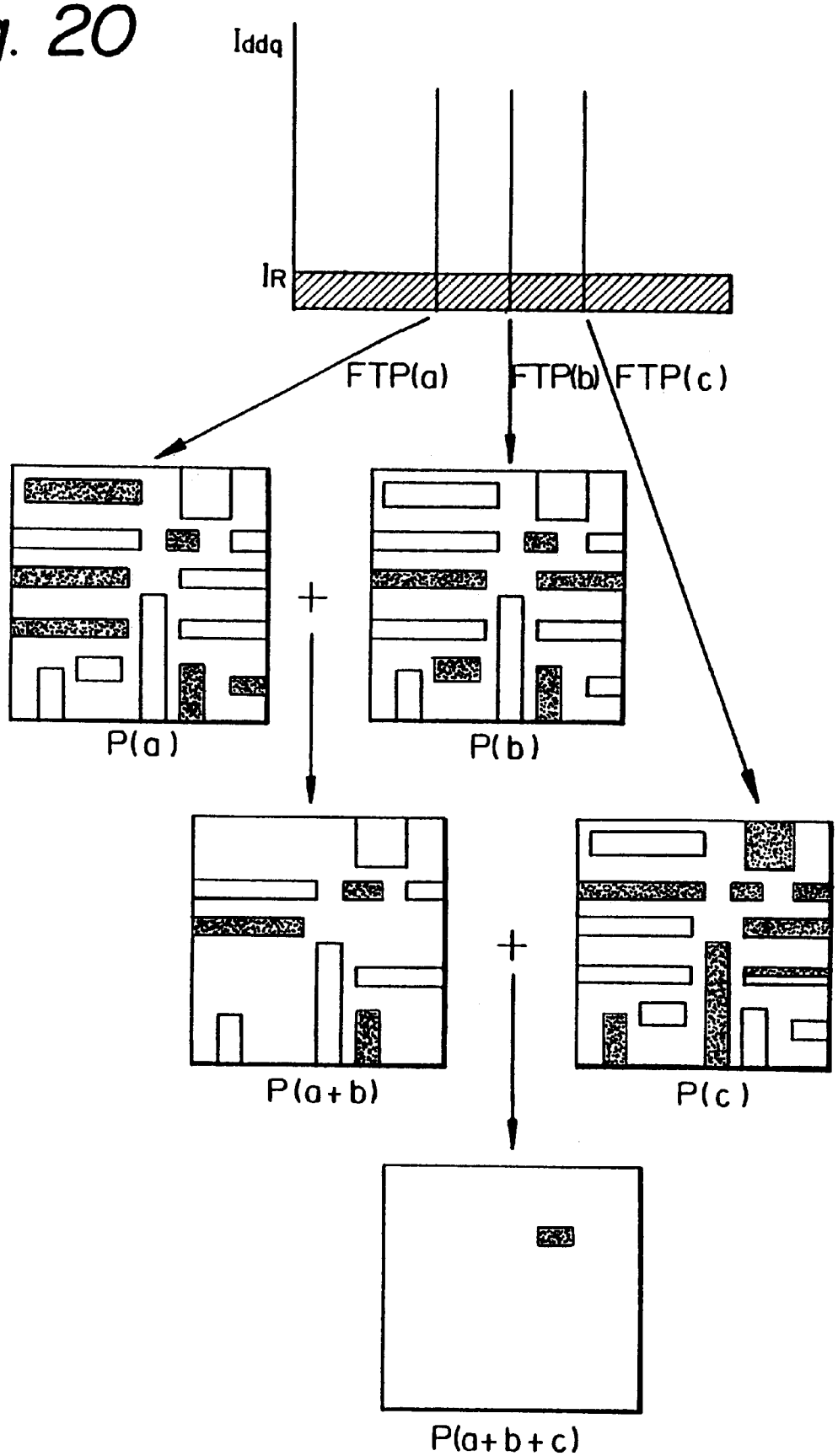
FIG. 20 is a diagram for explaining the flowchart of FIG. 19.

FIG. 19 is a flowchart showing a fourth operation of the control circuit 10 of FIG. 3, and FIG. 20 is a diagram for explaining the flowchart of FIG. 19.

First, at step 1901, a number N is cleared, and at step 1902, the address ADD is cleared.

At step 1903, it is determined whether or not $I_{ddq} > I_R$ is satisfied. If $I_{ddq} \leq I_R$, the control returns to step 1904. On the other hand, if $I_{ddq} > I_R$, the control proceeds to step 1909. That is, as shown in FIG. 20, only at the functional test patterns FTP(a), FTP(b) and FTP(c), when the quiescent $V_{DD}$ supply current $I_{ddq}$ is abnormal, does the control proceed to step 1904.

At step 1904, a potential contrast image P(ADD) is calculated in accordance with the output of the secondary electron detector 24.

Next, at step 1905, it is determined whether or riot the value of the number N is 0. As a result, if N is 0, which means that a potential contrast image P(a) as shown in FIG. 20 is calculated at step 1904, the control at step 1905 proceeds to step 1907. Otherwise, the control proceeds to step 1906.

For example, if N=1, which means that a potential contrast image P(b) as shown in FIG. 20 is calculated at step 1904, the control at step 1905 proceeds to step 1906, which performs an adding operation upon the potential contrast images P(a) and P(b) to obtain a potential contrast image P(a+b) as shown in FIG. 20 defined by P(a+b)=P(a)+P(b)

Also, if N=2, which means that a potential contrast image P(c) as shown in FIG. 20 is calculated at step 1904, the control at step 1905 also proceeds to step 1906, which performs an adding operation upon the potential contrast images P(a+b) and P(c) to obtain a potential contrast image P(a+b+c) as shown in FIG. 20 defined by P(a+b+c)=P(a+b)+P(c)

Next, at step 1907, N is incremented by +1. Then, at step 1908, it is determined whether or not N is larger than 2. As a result, if N$\geq$3, the control proceeds to step 1911. Otherwise, the control proceeds to step 1909.

Steps 1909 and 1910 repeat the operation at steps 1903 through 1907 until ADD reaches its maximum value MAX.

Then, the routine of FIG. 19 is completed by step 1911.

Thus, the potential contrast image such as P(a+b+c) including fault points can be obtained.

The fourth operation is superior to the first, second and third operations in terms of accuracy and speed of estimation of fault points.

In the above-described fourth operation, the adding operation is performed upon three potential contrast images based upon abnormal currents, however, the fourth operation of the present invention can be applied to an adding operation upon two potential contrast images or four or more potential contrast images based upon abnormal currents. In this case, at step 1908, it is determined whether or not N$\geq$m (m=2, 4, 5, . . . ) is satisfied.

Figure 21A:
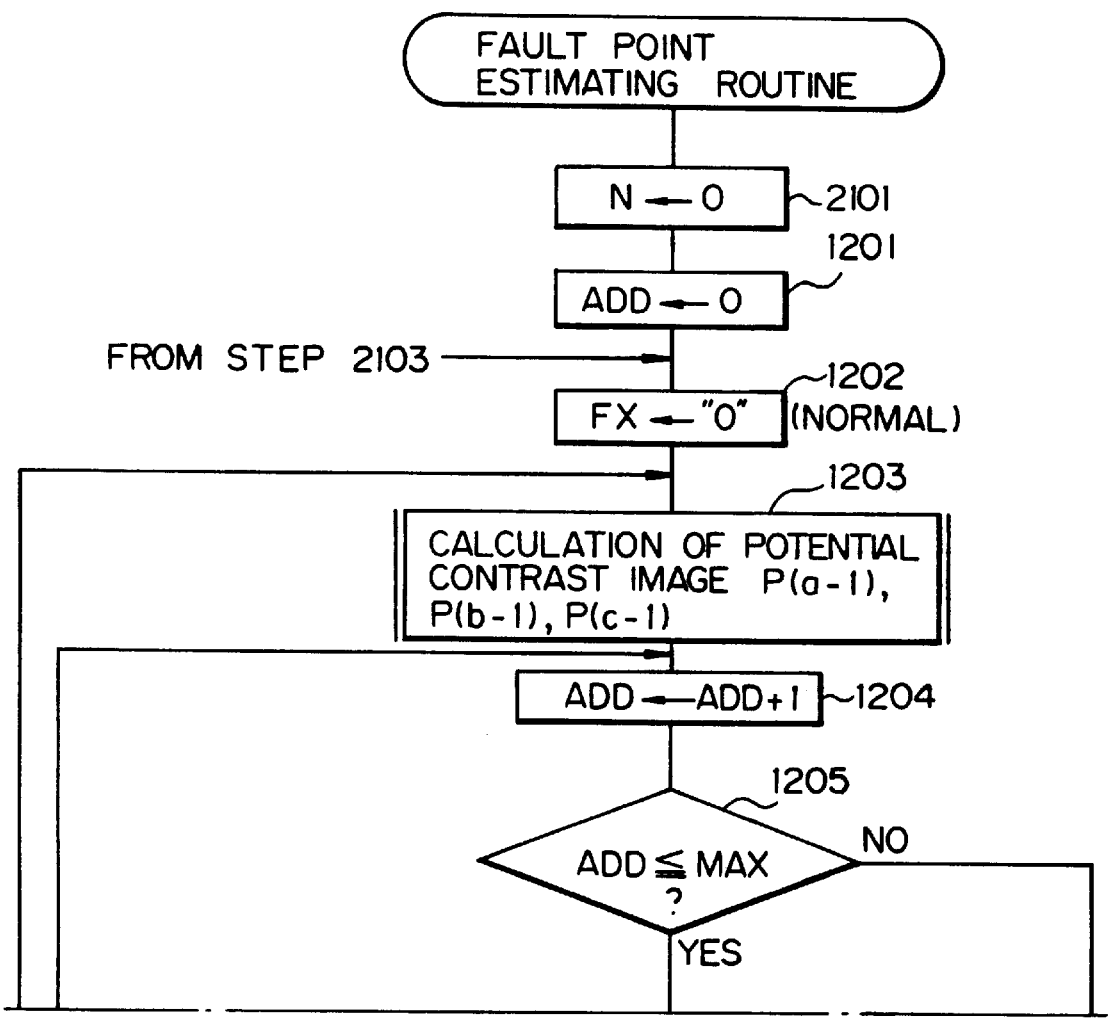
FIG. 21A, 21B and 21C are a flowchart showing a fifth operation of the control circuit 10 of FIG. 3.
Figure 21B:
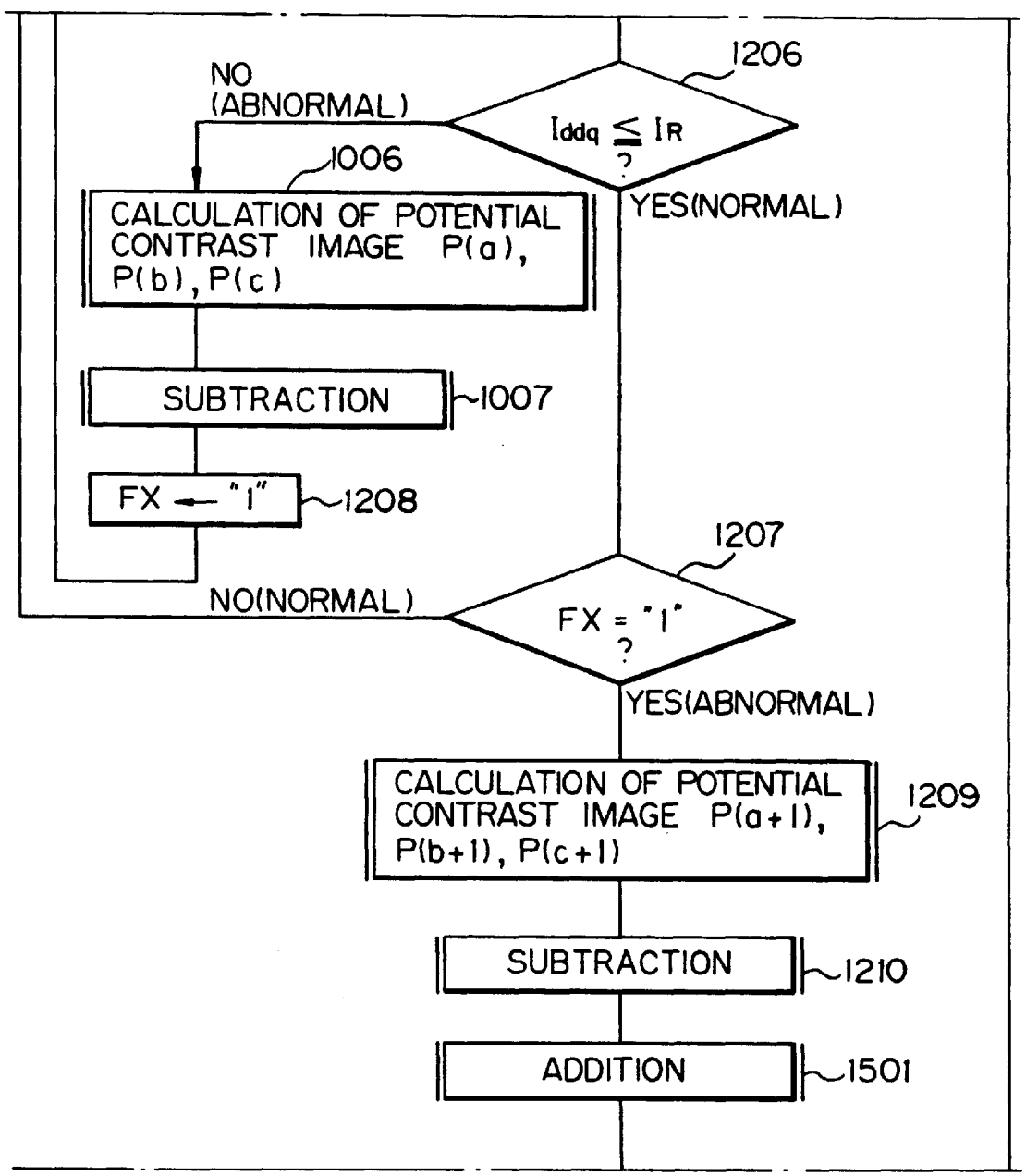
Figure 21C:
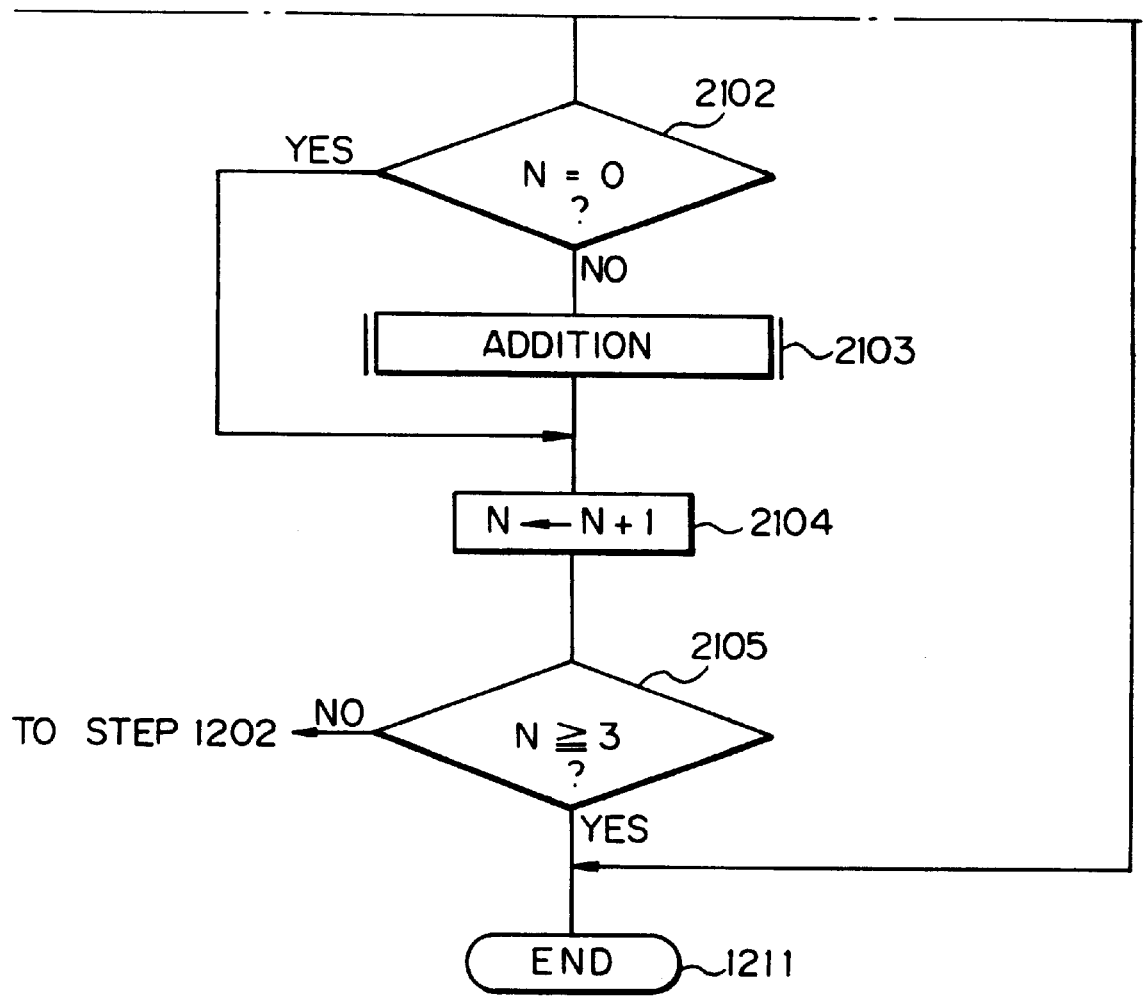
Figure 22:
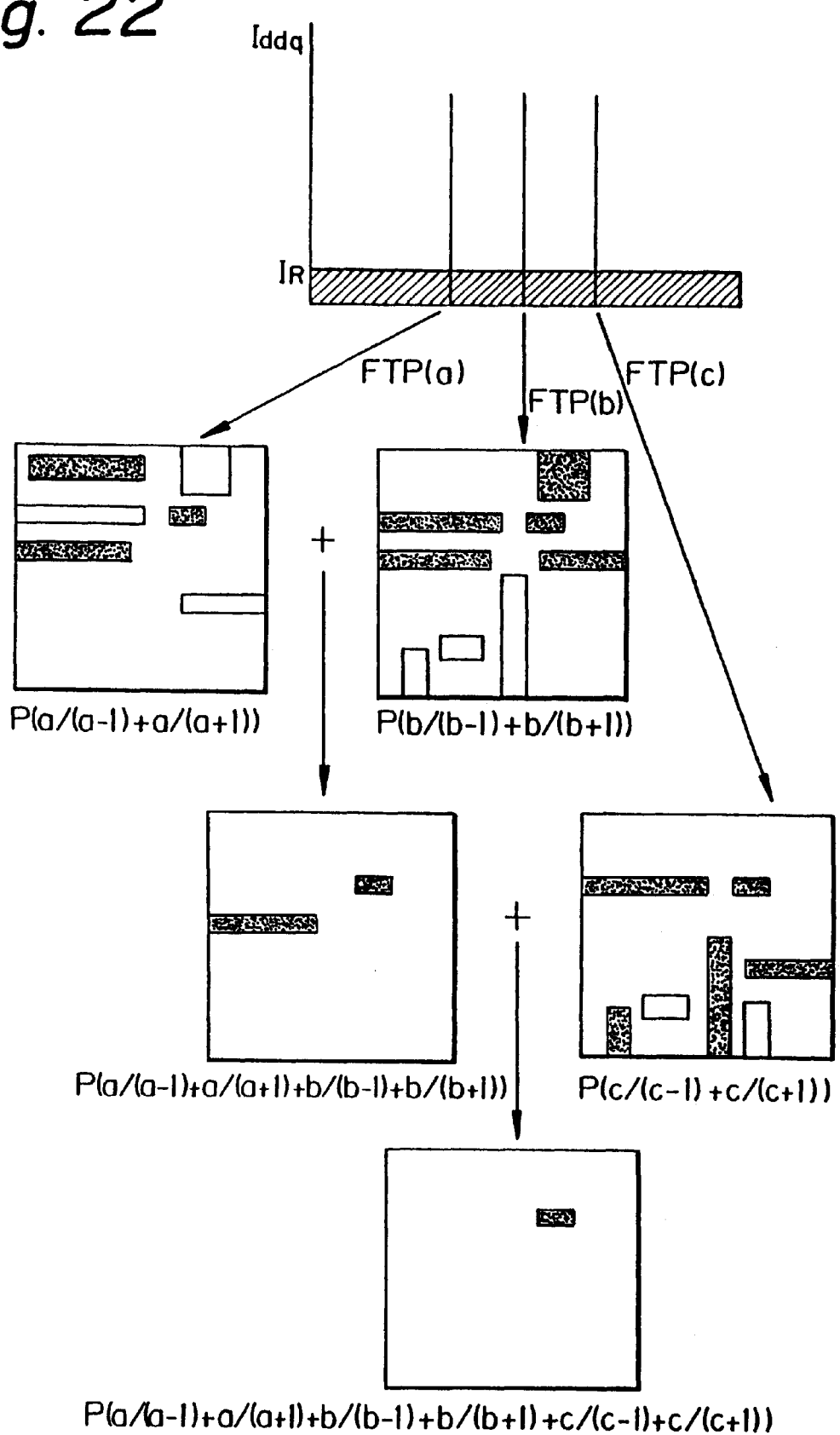
FIG. 22 is a diagram for explaining the flowchart of FIGS. 21A, 21B and 21C.

FIG. 21A, 21B and 21C are a flowchart showing a fifth operation of the control circuit 10 of FIG. 3, and FIG. 22 is a diagram for explaining the flowchart of FIGS. 21A, 21B and 21C. In FIGS. 21A, 21B and 21C, the third operation as shown in FIGS. 14A and 14B is carried out three times. That is, steps 2101 through 2105 are added to the flowchart of FIGS. 14A and 14B.

In FIGS. 21A, 21B and 21C, when N=0 by step 2101, a potential contrast image P(a/(a−1)+a(a+1)) as shown in FIG. 22 is calculated at step 1501 in the same way as in FIGS. 14A and 14B. Then, the control returns via steps 2102, 2104 and 2105 to step 1202. As a result, N=1.

Next, since N=1, a potential contrast image P(b/(b−1)+b(b+1)) as shown in FIG. 22 is calculated at step 1501 in the same way as in FIGS. 14A and 14B. Then, the control returns via step 2102 to step 2103. As a result, at step 2103, as shown in FIG. 22, an adding operation is performed upon the two potential contrast images P(a/(a−1)+a(a+1)) and P(b/(b−1)+b(b+1)) to obtain a potential contrast image P(a/(a−1)+a(a+1)+b/(b−1)+b(b+1)) defined by P(a/(a−1)+a(a+1)+b/(b−1)+b(b+1))
  P(a/(a−1)+a(a+1))+P(b/(b−1)+b(b+1))

Then, the control returns via steps 2104 and 2105 to step 1202. As a result, N=2.

Next, since N=2, a potential contrast image P(c/(c−1)+c(c+1)) as shown in FIG. 22 is calculated at step 1501 in the same way as in FIGS. 14A and 14B. Then, the control returns via step 2102 to step 2103. As a result, at step 2103, as shown in FIG. 22, an adding operation is performed upon the two potential contrast images P(a/(a−1)+a(a+1)+b/(b−1)+b/(b+1)) and P(c/(c−1)+c(c+1)) to obtain a potential contrast image P(a/(a−1)+a(a+1)+b/(b−1)+b(b+1)+c/(c−1)+c(c+1)) defined by $$P(a/(a-1)+a(a+1)+b/(b-1)+b(b+1)+c(c-1)+c(c+1)) =$$
$$P(a/(a-1)+a(a+1)+b/(b-1)+b(b+1))+P(c/(c-1)+c(c+1))$$

Then, the control proceeds via steps 21.04 and 2105 to step 1211, thus completing the routine of FIGS. 21A and 21B.

The fifth operation is superior to the first, second and third operations in terms of accuracy and speed of estimation of fault points.

In the above-described fifth operation, the adding operation is performed upon three potential contrast images based upon abnormal currents, however, the fifth operation of the present invention can be applied to an adding operation upon two potential contrast images or four or more potential contrast images based upon abnormal currents. In this case, at step 2105, it is determined whether or not N$\geq$m (m=2, 4, 5, . . . ) is satisfied.

Figure 23A:
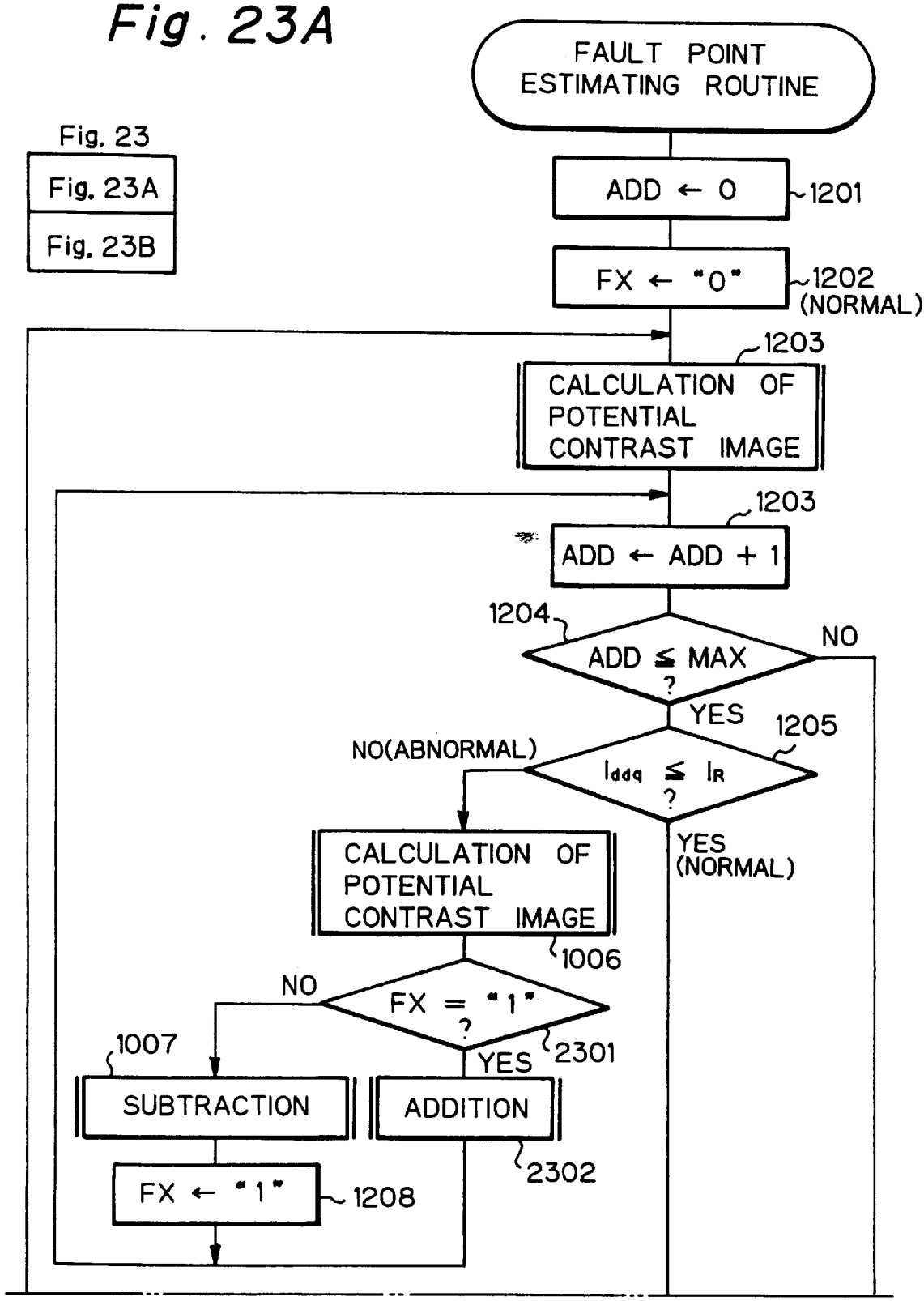
FIGS. 23A and 23B are a flowchart showing a sixth operation of the control circuit 10 of FIG. 3.
Figure 23B:
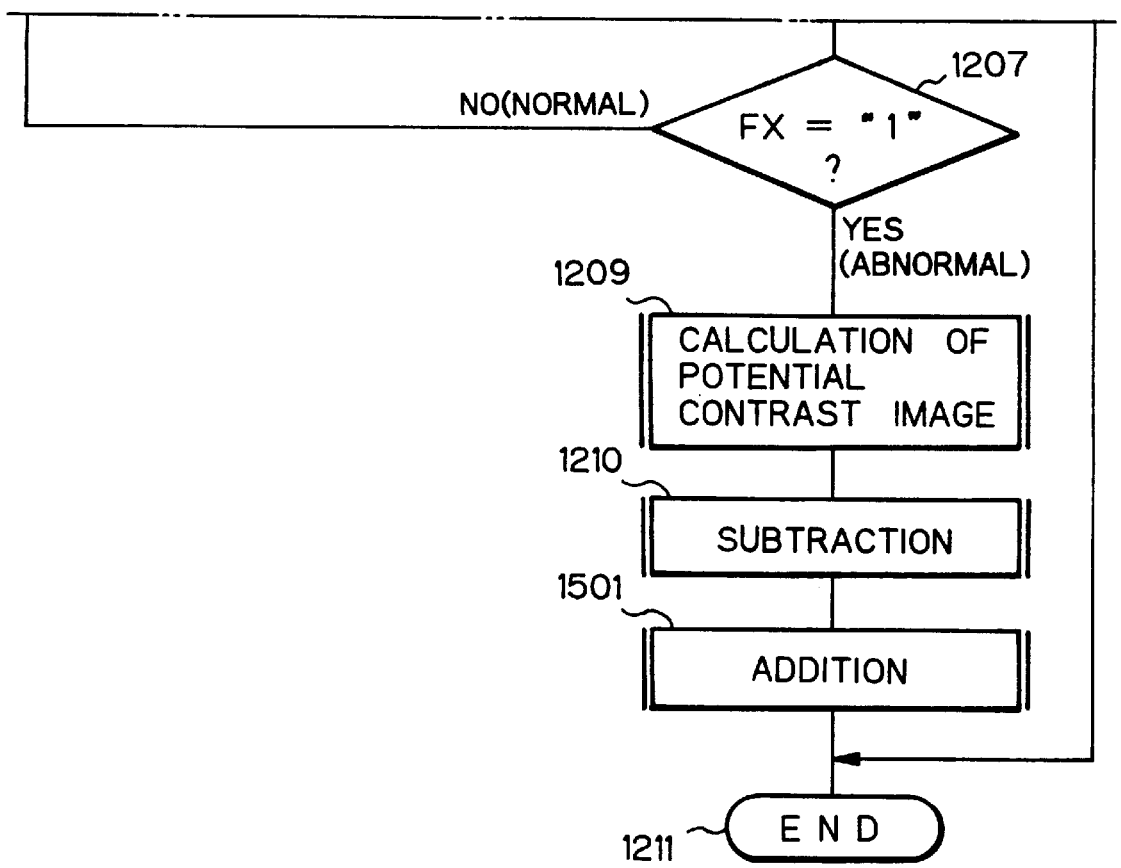
Figure 24:
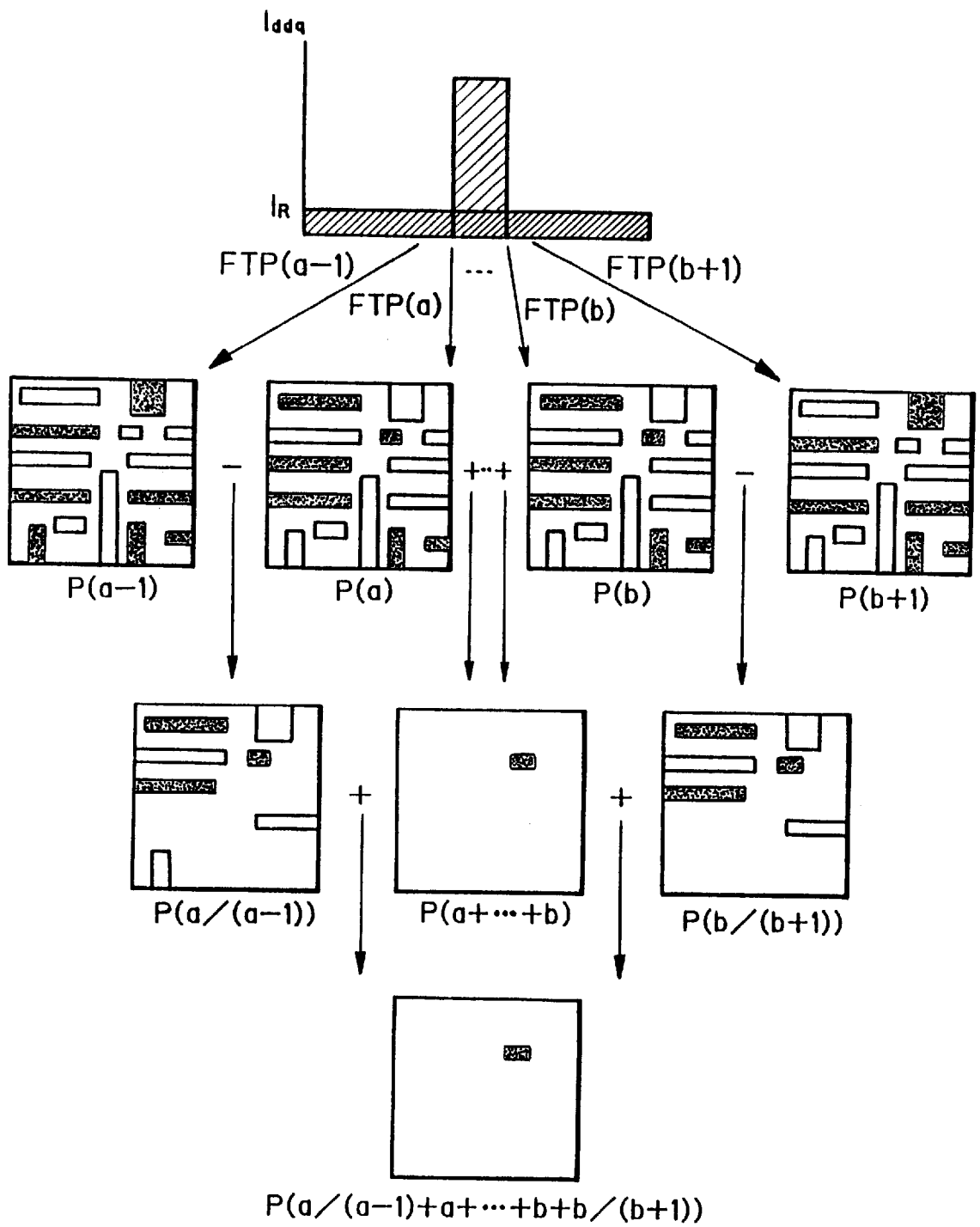
FIG. 24 is a diagram for explaining the flowchart of FIGS. 23A and 23B.

FIGS. 23A and 23B are a flowchart showing a sixth operation of the control circuit 10 of FIG. 3, and FIG. 24 is a diagram for explaining the flowchart of FIGS. 23A and 23B. In FIGS. 23A and 23B, steps 2301 and 2302 are added to the flowchart of FIG. 14. That is, when the quiescent $V_{DD}$ supply current $I_{ddq}$ is abnormal continuously from the functional test pattern FTP(a) to the functional test pattern FTP(b), the control proceeds via step 2301 to step 2302 which performs an adding operation upon two potential contrast images continuously to obtain a potential contrast image P(a+ . . . +b) as shown in FIG. 24. In Lhs case, at step 1501, an adding operation is performed upon the three potential contrast images P(a/(a−1)), P(a+ . . . +b) and P(b/(b+1)) to obtain a potential contrast image P(a/(a−1)+a+ . . . +b+b/(b+1)) defined by P(a/(a−1)+a+ . . . +b+b/(b+1))
  P(a/(a−1))+P(a+ . . . +b)+P(b/(b+1))

Thus, a potential contrast image P(a/(a−1)+a+ . . . +b+b/(b+1)) including fault points can be obtained.

Figure 25:
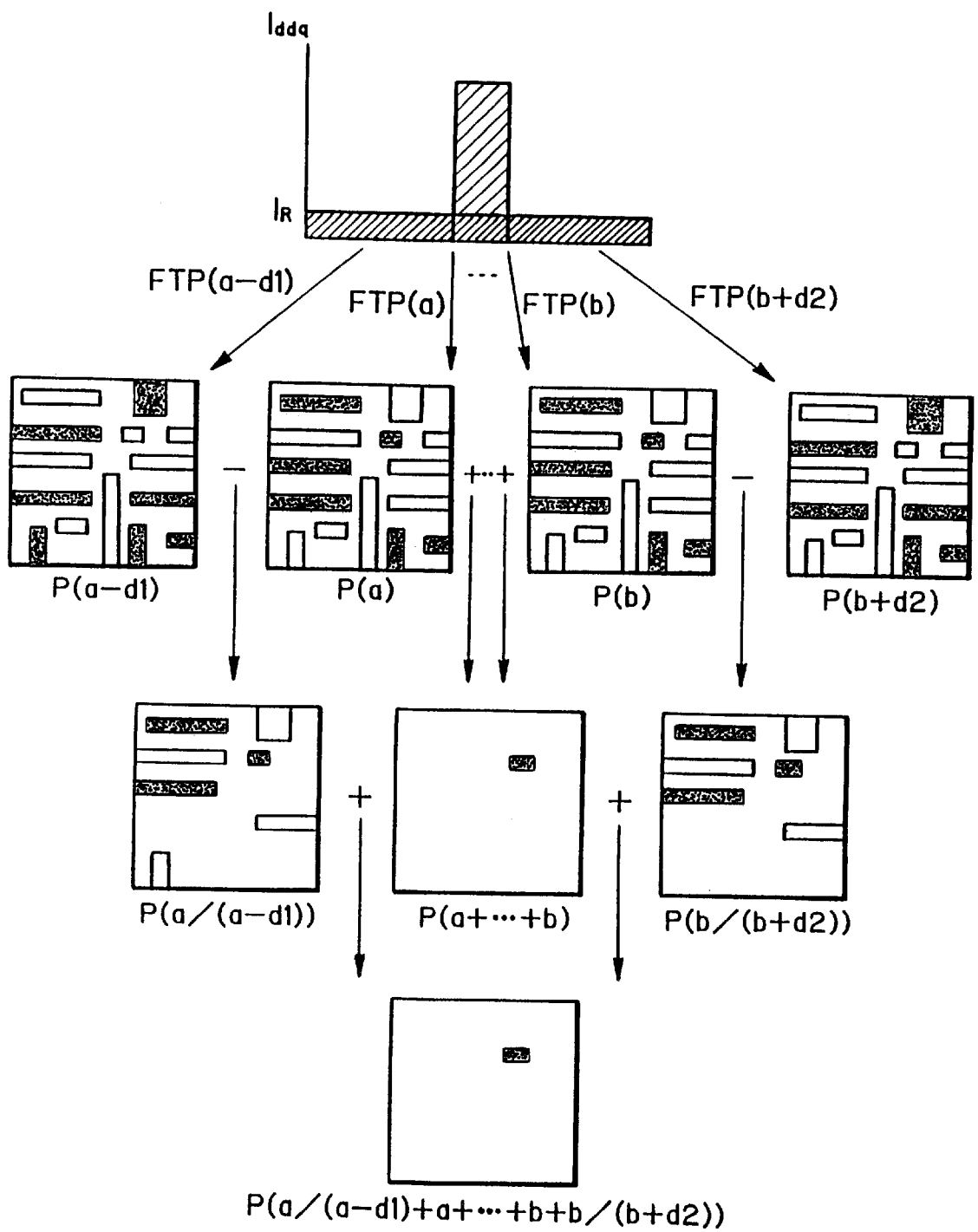
FIG. 25 is a diagram illustrating a modification of the diagram of FIG. 24.

In FIGS. 23A, 23B and 24, although a subtracting operation is performed upon a potential contrast image P(a) or P(b) based upon the detection of an abnormal current and its inmmediately neighboring potential contrast image P(a−1) or P(b+1), it is possible to perform a subtracting operation upon the potential contrast image P(a) and a potential contrast image P(a−d1) as shown in FIG. 25, and it is possible to perform a subtracting operation upon the potential contrast image P(b) and a potential contrast image P(b+d2) as shown in FIG. 25.

Figure 26:
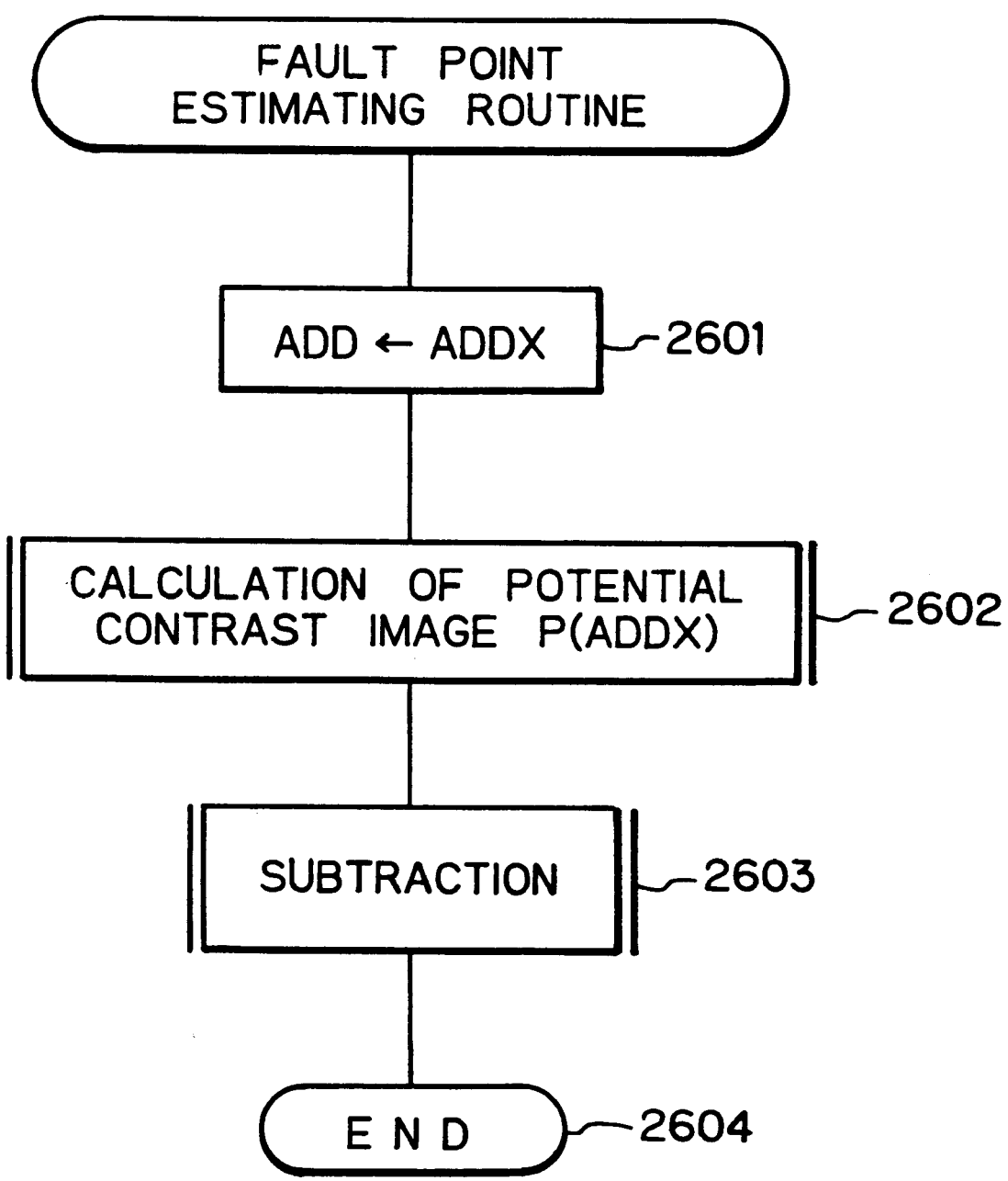
FIG. 26 is a flowchart showing a seventh operation of the control circuit of FIG. 3.
Figure 27:
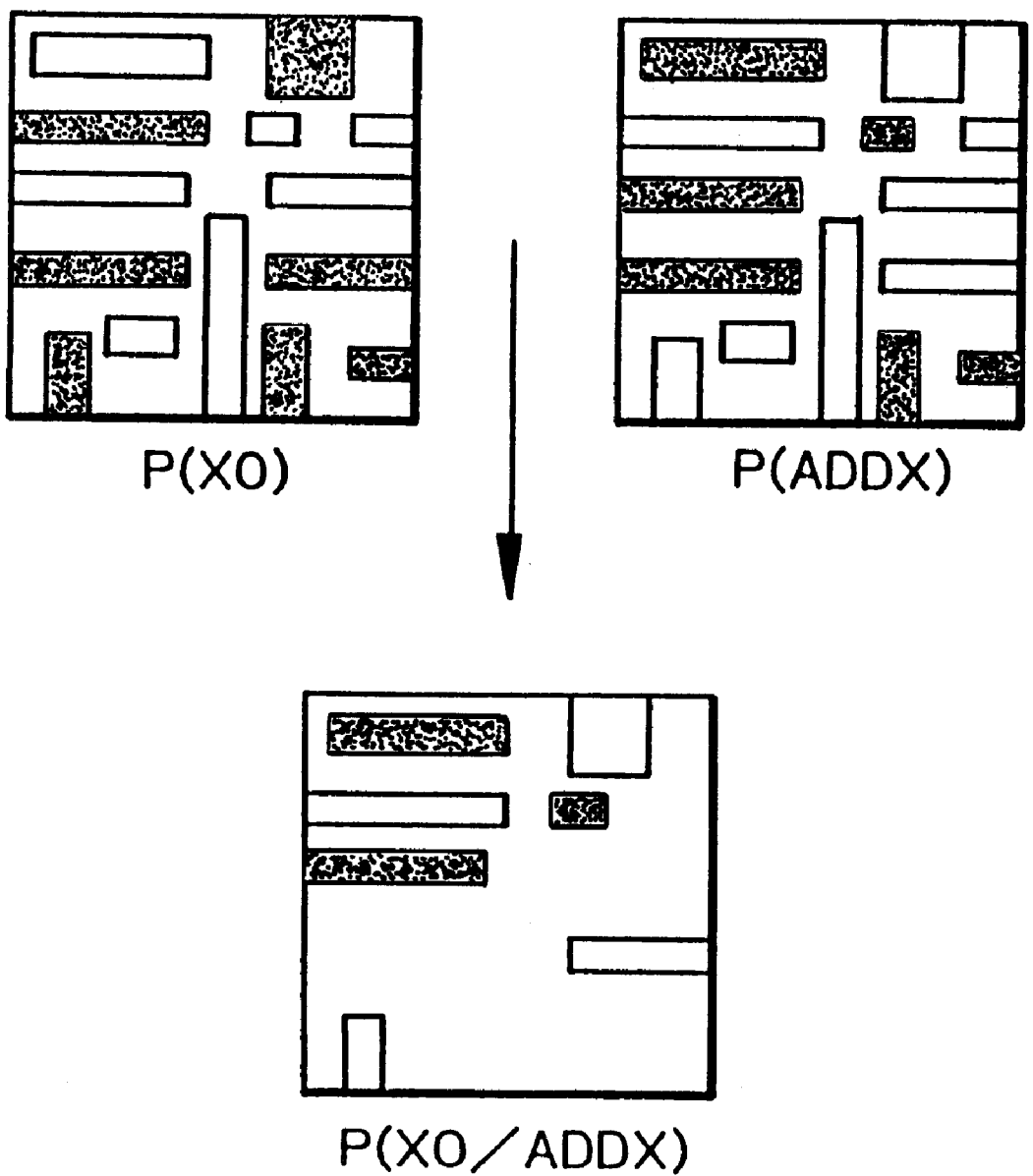
FIG. 27 is a diagram showing the flowchart of FIG. 26.

FIG. 26 is a flowchart showing a seventh operation of the control circuit, 10 of FIG. 3, and FIG. 27 is a diagram for explaining the flowchart of FIG. 26.

First, at step 2601, a special address ADDX is assigned to the address ADD.

Next, at step 2602, a potential contrast image P(ADDX) as shown in FIG. 27 is calculated in accordance with the output of the secondary electron detector 24.

Next, at step 2603, a subtracting operation is performed upon the potential contrast image P(ADDX) and a potential contrast image P(XO) as shown in FIG. 27 preset based upon an acceptable semiconductor device.

Then, the routine of FIG. 26 is completed by step 2604.

Thus, the potential contrast image P(XO/ADDX) including fault points can be obtained.

Figure 28:
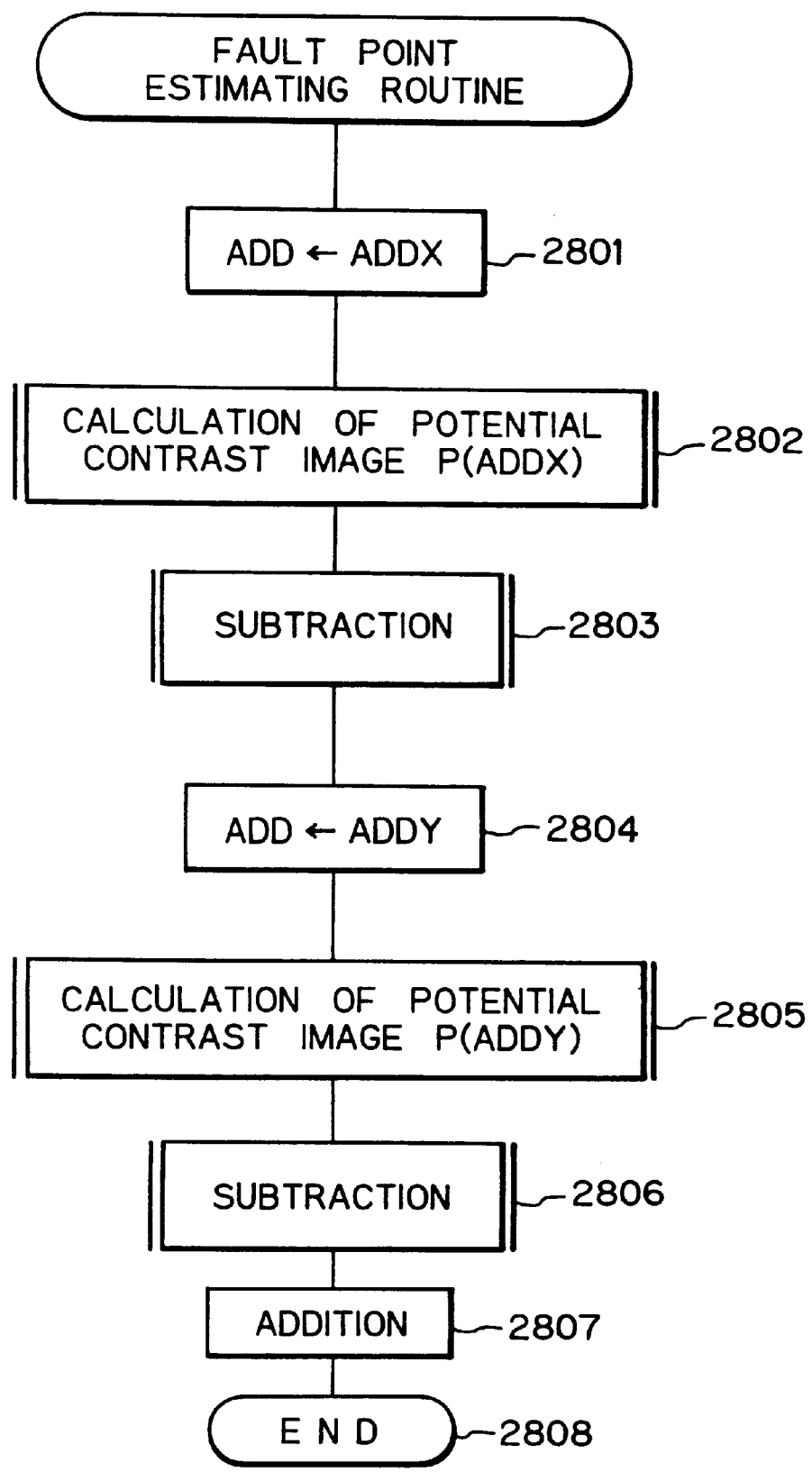
FIG. 28 is a flowchart showing a modification of the routine FIG. 26.

In FIG. 28, which is a modification of the routine of FIG. 26, special addresses ADDX and ADDY are assigned to the address ADD.

First, at step 2801, a special address ADDX is assigned to the address ADD.

Next, at step 2802, a potential contrast image P(ADDX) is calculated in accordance with the output of the secondary electron detector 24.

Next, at step 2803, a subtracting operation is performed upon the potential contrast image P(ADDX) and a potential contrast image P(XO) preset based upon an acceptable semiconductor device.

First, at step 2804, a special address ADDY is assigned to the address ADD.

Next, at step 2805, a potential contrast image P(ADDY) is calculated in accordance with the output of the secondary electron detector 24.

Next, at step 2806, a subtracting operation is performed upon the potential contrast image P(ADDY) and a potential contrast, image P(YO) preset based upon an acceptable semiconductor device.

Next, at step 2807, an adding operation is performed upon the potential contrast images P(XO/ADDX) and P(YO/ADDY).

Then, the routine of FIG. 28 is completed by step 2808.

Thus, the potential contrast image P(XO/ADDX+YO/ADDY) including fault points can be obtained.

Note that the present invention can be applied to three or more special addresses.

Figure 29A:
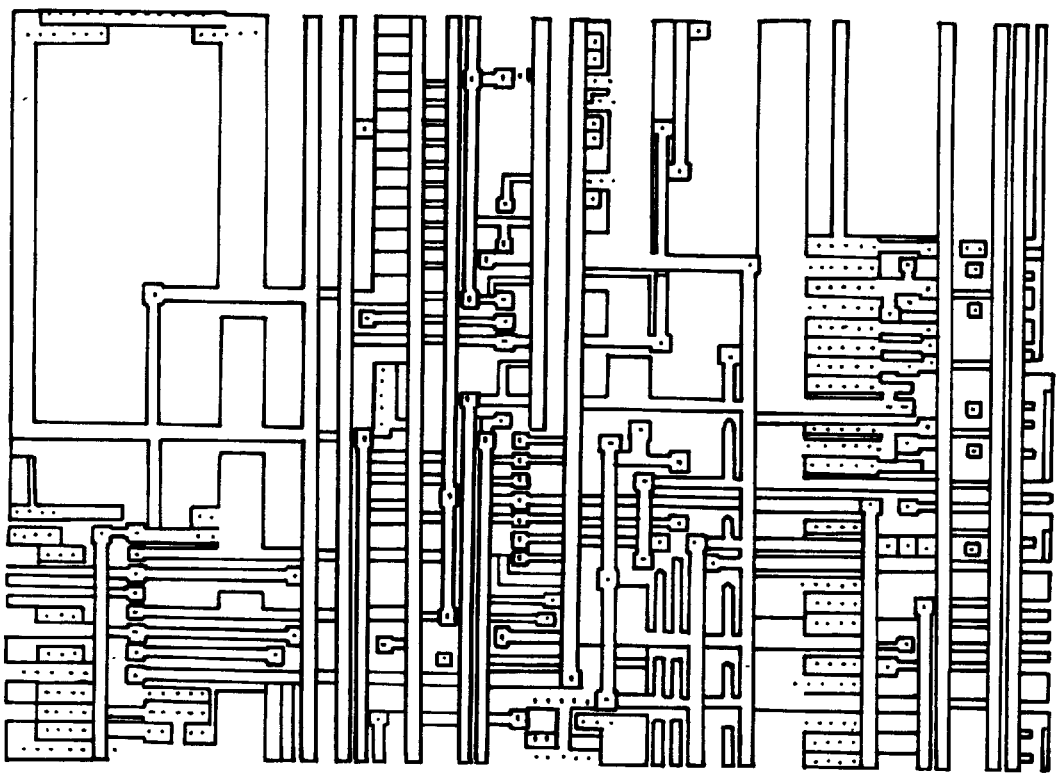
FIGS. 29A and 29B are layout diagrams showing a semiconductor device.
Figure 29B:
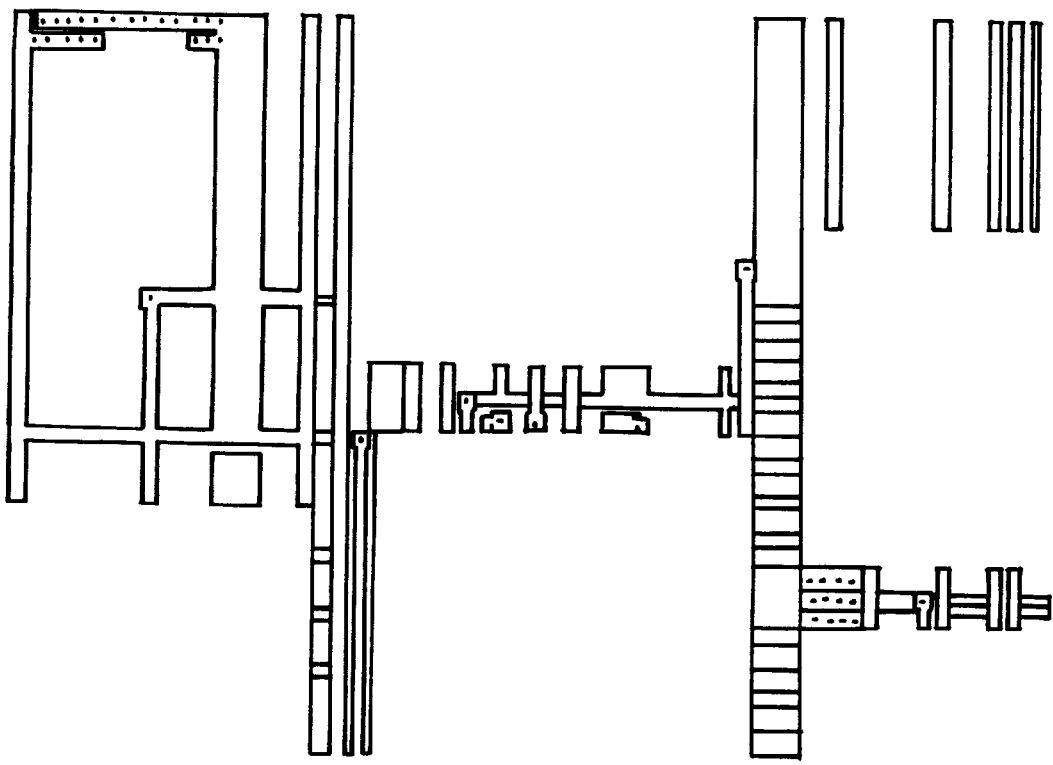

In the above-described embodiments, a potential contrast image is calculated for each logic block including signal lines (or power supply lines) as shown in FIG. 29A. However, in the present invention, potential contrast images can be calculated for only the signal lines (or power supply lines), thus reducing the amount of analyzed data, to thereby enhance the operation speed.

As explained hereinabove, according to the present invention, since a fault point within a semiconductor device is determined by analyzing potential contrast images, a fault point can be easily and rapidly estimated without comparing unacceptable devices with acceptable devices and without monitoring the output signals of the semiconductor device.

I claim:

1. A method for estimating a fault point in a semiconductor device, comprising:

generating functional test patterns;

transmitting said functional test patterns to said semiconductor device;

detecting an abnormal current flowing through said semiconductor device caused by at least one of said functional test patterns;

irradiating said semiconductor device with electrons;

detecting secondary electrons from said semiconductor device;

calculating potential contrast images in accordance with said secondary electrons in response to said functional test patterns; and performing logic operations upon said potential contrast images, only from said semiconductor device, in accordance with whether said abnormal current is detected in order to estimate said fault point within said semiconductor device.

2. The method as set forth in claim 1, wherein said calculating potential contrast images further comprises converting each pixel of said potential contrast images into one of a black pixel, a white pixel, and a gray pixel, wherein the gray pixel has a luminance between said black pixel and said white pixel.

3. The method as set forth in claim 2, wherein said performing logic operations further comprises adding said potential contrast images defined by:

(black pixel)+(black pixel)=(black pixel);
(black pixel)+(white pixel)=(gray pixel);
(white pixel)+(white pixel)=(white pixel);
(black pixel)+(gray pixel)=(gray pixel);
(white pixel)+(gray pixel)=(gray pixel); and
(gray pixel)+(gray pixel)=(gray pixel).

4. The method as set forth in claim 2, wherein said performing logic operations further comprises subtracting said potential contrast images defined by:

(black pixel)−(black pixel)=(gray pixel);
(white pixel)−(white pixel)=(gray pixel);
(black pixel)−(white pixel)=(black pixel);
(white pixel)−(black pixel)=(white pixel);
(black pixel)−(gray pixel)=(gray pixel);
(white pixel)−(gray pixel)=(gray pixel);
(gray pixel)−(black pixel)=(gray pixel);
(gray pixel)−(white pixel)=(gray pixel); and
(gray pixel)−(gray pixel)=(gray pixel).

5. The method as set forth in claim 1, wherein said semiconductor device has conductive layers having no insulating layer thereon.

6. The method as set forth in claim 1, wherein said calculating potential contrast images further comprises calculating correlations between said potential contrast images and corresponding layout information of conductive layers of said semiconductor device.

7. The method as set forth in claim 1, further comprising:

extracting a first potential contrast image when said abnormal current does not flow through said semiconductor device; and extracting a second potential contrast image when said abnormal current flows through said semiconductor device, wherein said performing logic operations further comprises subtracting said first and second potential contrast images to obtain an improved potential contrast image.

8. The method as set forth in claim 1, further comprising:

extracting a first potential contrast image when a first functional test pattern is generated so that said abnormal current flows through said semiconductor device;

extracting a second potential contrast image when a second functional test pattern is generated immediately before said first functional test pattern, so that said abnormal current does not flow through said semiconductor device; and extracting a third potential contrast image when a third functional test pattern is generated immediately after said first functional test pattern so that said abnormal current does not flow through said semiconductor device, wherein said performing logic operations further comprises:

subtracting said first and second potential contrast images to obtain a fourth potential contrast image;

subtracting said first and third potential contrast images to obtain a fifth potential contrast image; and adding said fourth and fifth potential contrast images to obtain an improved potential contrast image.

9. The method as set forth in claim 1, further comprising:

extracting a plurality of potential contrast images when said abnormal current flows through said semiconductor device, wherein said performing logic operations further comprises adding said plurality of potential contrast images to obtain an improved potential contrast image.

10. The method as set forth in claim 1, further comprising:

extracting a first potential contrast image when a first functional test pattern is generated so that said abnormal current does not flow through said semiconductor device;

extracting a plurality of second potential contrast images when a plurality of second functional test patterns are continuously generated after said first functional test pattern, so that said abnormal current flows through said semiconductor device; and extracting a third potential contrast image when a third functional test pattern is generated immediately after said plurality of second functional test patterns so that said abnormal current does not flow through said semiconductor device, wherein said performing logic operations further comprises:

subtracting said first potential contrast image and one of said second potential contrast images to obtain a fourth potential contrast image;

subtracting the one of said second potential contrast images and said third potential contrast image to obtain a fifth potential contrast image; and adding said fourth and fifth potential contrast images to obtain an improved potential contrast image.

11. The method as set forth in claim 10, wherein said first functional test pattern is generated immediately before said plurality of second functional test patterns, and said third functional test pattern is generated immediately after said plurality of second functional test patterns.

12. The method as set forth in claim 1, wherein said semiconductor device is a CMOS integrated device.

13. The method as set forth in claim 1, wherein said calculating potential contrast images further comprises calculating one of said potential contrast images when said abnormal current is larger than a certain value and another of said potential contrast images when said abnormal current is smaller than said certain value.

14. The method as set forth in claim 1, wherein said calculating potential contrast images further comprises calculating said potential contrast images only for signal lines of said semiconductor device.

15. A method for estimating a fault point in a semiconductor device, comprising:

generating at least one particular functional test pattern;

transmitting said at least one particular functional test pattern to said semiconductor device;

irradiating said semiconductor device with electrons;

detecting secondary electrons from said semiconductor device;

calculating at least one potential contrast image in accordance with said secondary electrons in response to said at least one particular functional test pattern; and performing a logic operation upon said at least one potential contrast image and a preset potential contrast image to estimate said fault point within said semiconductor device.

16. The method as set forth in claim 15, wherein said calculating at least one potential contrast image further comprises converting each pixel of said at least one potential contrast image into one of a black pixel, a white pixel, and a gray pixel, wherein the gray pixel has a luminance between said black pixel and said white pixel.

17. The method as set forth in claim 16, wherein said performing a logic operation further comprises subtracting said at least one potential contrast image defined by:

(black pixel)−(black pixel)=(gray pixel);

(white pixel)−(white pixel)=(gray pixel);

(black pixel)−(white pixel)=(black pixel);

(white pixel)−(black pixel)=(white pixel);

(black pixel)−(gray pixel)=(gray pixel);

(white pixel)−(gray pixel)=(gray pixel);

(gray pixel)−(black pixel)=(gray pixel);

(gray pixel)−(white pixel)=(gray pixel); and (gray pixel)−(gray pixel)=(gray pixel).

18. The method as set forth in claim 15, wherein said semiconductor device has conductive layers having no insulating layer thereon.

19. The method as set forth in claim 15, wherein said calculating at least one potential contrast image further comprises calculating correlations between said at least one potential contrast image and corresponding layout information of conductive layers of said semiconductor device.

20. The method as set forth in claim 15, wherein said calculating at least one potential contrast image further comprises calculating said at least one potential contrast image only for signal lines of said semiconductor device.

21. A system for estimating a fault point in a semiconductor device, comprising:

a pattern generator connected to said semiconductor device;

an electron irradiator positioned so as to irradiate said semiconductor device;

a secondary electron detector positioned so as to detect secondary electrons from said semiconductor device; and a controller circuit connected to said secondary electron detector so as to perform logic operations upon potential contrast images, only said semiconductor devices, calculated in accordance with said detected secondary electrons, in order to estimate said fault point within said semiconductor device.

22. A system as set forth in claim 21, wherein said pattern generator further comprises:

a memory connected to said controller circuit;

a timing generator connected to said memory;

a pattern generator connected to said memory; and a format controller connected to said timing generator, said pattern generator, and said semiconductor device.

23. A system as set forth in claim 21, wherein said controller circuit further comprises:

a calculator; and a logic operator.

24. A system as set forth in claim 21, further comprising a current detector connected to said semiconductor device and said controller circuit.

25. The method as set forth in claim 1, wherein said steps of irradiating said semiconductor device and detecting secondary electrons occur during flow of said abnormal current.

* * * * *